(12) United States Patent
Takahashi

(10) Patent No.: US 10,564,339 B2
(45) Date of Patent: Feb. 18, 2020

(54) PHASE DIFFERENCE FILM, CIRCULARLY POLARIZING FILM, AND IMAGE DISPLAY DEVICE

(71) Applicant: FUJIFILM Corporation, Tokyo (JP)

(72) Inventor: Yuta Takahashi, Kanagawa (JP)

(73) Assignee: FUJIFILM Corporation, Tokyo (JP)

(\*) Notice: Subject to any disclaimer, the term of this patent is extended or adjusted under 35 U.S.C. 154(b) by 121 days.

(21) Appl. No.: 15/702,018

(22) Filed: Sep. 12, 2017

(65) Prior Publication Data

US 2018/0011234 A1 Jan. 11, 2018

Related U.S. Application Data

(63) Continuation of application No. PCT/JP2016/057623, filed on Mar. 10, 2016.

(30) Foreign Application Priority Data

Mar. 30, 2015 (JP) .................................. 2015-069908

(51) Int. Cl.
*G02B 5/30* (2006.01)
*G02F 1/13363* (2006.01)
(Continued)

(52) U.S. Cl.
CPC ....... *G02B 5/3083* (2013.01); *C08G 64/1608* (2013.01); *C08G 64/183* (2013.01);
(Continued)

(58) Field of Classification Search
CPC ...... G02B 5/3083; G02B 1/08; G02B 5/3025; G02B 5/30; G02B 5/3033; G02B 5/3041;
(Continued)

(56) References Cited

U.S. PATENT DOCUMENTS 7,948,592 B2 \* 5/2011 Do ...................... G02F 1/13363
349/117
8,134,659 B2 \* 3/2012 Takahashi ............ G02B 5/3016
349/96
(Continued)

FOREIGN PATENT DOCUMENTS

CA 2316828 C \* 2/2010 ............... G02B 1/10
EP 2378320 A1 \* 10/2011 ......... C08G 64/0208
(Continued)

OTHER PUBLICATIONS

Notification of Reasons for Refusal issued by the Japanese Patent Office dated Oct. 9, 2018, in connection with Japanese Patent Application No. 2017-509486.

(Continued)

*Primary Examiner* — Arnel C Lavarias
(74) *Attorney, Agent, or Firm* — Edwards Neils LLC; Jean C. Edwards, Esq.

(57) ABSTRACT

A phase difference film and a circularly polarizing film each achieve suppressed coloration when viewed from the front direction, a smaller difference in tint between views from the front direction and the oblique direction, and suppressed image unevenness, where the film is applied to an image display panel, in particular, an organic EL panel; as well as an image display device including the circularly polarizing film. The phase difference film includes optically anisotropic layers A and B, in which a retardation RthA of layer A in the thickness direction at a wavelength of 550 nm is larger than 0, layer A exhibits predetermined optical properties, a retardation RthB of layer B in the thickness direction at a wavelength of 550 nm is smaller than 0, layer B satisfies predetermined optical properties, and the angle formed between a slow axis of the optically anisotropic layers A and B is 90°±10°.

8 Claims, 1 Drawing Sheet

(51) Int. Cl.

| | | |
|---|---|---|
| *G02F 1/1335* | (2006.01) | |
| *C08G 64/16* | (2006.01) | |
| *C08G 64/18* | (2006.01) | |
| *C08J 5/18* | (2006.01) | |
| *G02B 1/08* | (2006.01) | |
| *H01L 51/50* | (2006.01) | |
| *H01L 51/52* | (2006.01) | |
| *H05B 33/22* | (2006.01) | |

(52) U.S. Cl.
CPC .............. *C08J 5/18* (2013.01); *G02B 1/08* (2013.01); *G02B 5/3025* (2013.01); *G02F 1/1335* (2013.01); *G02F 1/13363* (2013.01); *H01L 51/5012* (2013.01); *H01L 51/5281* (2013.01); *H05B 33/22* (2013.01); *G02F 2001/133541* (2013.01); *G02F 2001/133637* (2013.01)

(58) Field of Classification Search
CPC ...... G02B 5/305; G02B 27/28; G02B 27/486; C08G 64/1608; C08G 64/183; C08J 5/18; G02F 1/1335; G02F 1/13363; G02F 2001/133541; G02F 2001/133637; G02F 1/133528; G02F 2001/133531; G02F 2001/133635; G02F 2001/133638; H01L 51/5012; H01L 51/5281; H05B 33/22
USPC .......... 359/489.01–489.07, 489.15, 489.17, 359/483.01; 349/117, 119, 120, 96, 98, 349/99, 102, 103, 131; 362/19; 353/20
See application file for complete search history.

(56) References Cited

U.S. PATENT DOCUMENTS

| | | | |
|---|---|---|---|
| 2006/0066787 A1 | 3/2006 | Yoda et al. | |
| 2009/0040454 A1 | 2/2009 | Ichihashi et al. | |
| 2009/0096970 A1* | 4/2009 | Sakai ................... | G02B 5/3016 349/117 |
| 2009/0290100 A1* | 11/2009 | Haruta ................. | C08J 5/18 349/75 |
| 2009/0316095 A1* | 12/2009 | Do ....................... | G02F 1/13363 349/118 |
| 2010/0271573 A1* | 10/2010 | Sakai ................... | G02F 1/13363 349/96 |
| 2012/0287379 A1* | 11/2012 | Koike ................. | G02F 1/133528 349/96 |
| 2013/0027767 A1* | 1/2013 | Morishima .......... | G02B 5/3083 359/361 |
| 2014/0284583 A1* | 9/2014 | Saitoh ................ | G02F 1/133528 257/40 |
| 2014/0320775 A1* | 10/2014 | Ishiguro ................ | G02B 27/26 349/15 |
| 2014/0375935 A1 | 12/2014 | Yamada et al. | |
| 2015/0042942 A1 | 2/2015 | Hatanaka et al. | |
| 2015/0049291 A1* | 2/2015 | Hatanaka ............. | G02B 5/3083 349/194 |
| 2015/0168608 A1* | 6/2015 | Wang ................... | G02B 5/3083 359/489.07 |
| 2015/0378076 A1* | 12/2015 | Gam .................... | G02B 5/3033 349/193 |
| 2017/0047555 A1* | 2/2017 | Ishiguro ................ | B32B 7/02 |
| 2018/0093404 A1* | 4/2018 | Hatano .................. | B29C 48/21 |

FOREIGN PATENT DOCUMENTS

| | | | |
|---|---|---|---|
| EP | 2821821 A1 * | 1/2015 | .......... G02B 5/3033 |
| JP | 10-239518 A | 9/1998 | |
| JP | 2006-284903 A | 10/2006 | |
| JP | 2007-206703 A | 8/2007 | |
| JP | 2012-212056 A | 11/2012 | |
| JP | 2014-224838 A | 12/2014 | |
| JP | 2015-106114 A | 6/2015 | |
| JP | 2015-163940 A | 9/2015 | |
| JP | 2015-175994 A | 10/2015 | |
| WO | 2013/137464 A1 | 9/2013 | |

OTHER PUBLICATIONS

International Search Report issued in PCT/JP2016/057623 dated Jun. 7, 2016.
Written Opinion issued in PCT/JP2016/057623 dated Jun. 7, 2016.
International Preliminary Report on Patentability issued by WIPO dated Oct. 12, 2017, in connection with International Patent Application No. PCT/JP2016/057623.

* cited by examiner

PHASE DIFFERENCE FILM, CIRCULARLY POLARIZING FILM, AND IMAGE DISPLAY DEVICE

CROSS-REFERENCE TO RELATED APPLICATIONS

This application is a Continuation of PCT International Application No. PCT/JP2016/057623 filed on Mar. 10, 2016, which was published under PCT Article 21(2) in Japanese, and which claims priority under 35 U.S.C. § 119(a) to Japanese Patent Application No. 2015-069908 filed on Mar. 30, 2015. The above is applications are hereby expressly incorporated by reference, in their entirety, into the present application.

BACKGROUND OF THE INVENTION

1. Field of the Invention

The present invention relates to a phase difference film, a circularly polarizing film, and an image display device.

2. Description of the Related Art

Conventionally, a circularly polarizing film has been used for image display panels such as an organic electroluminescence (EL) panel and a liquid crystal display panel in order to suppress adverse effects due to external light reflection.

Use of a circularly polarizing film in which a retardation plate (so-called broadband λ/4 plate) consisting of a λ/2 plate and a λ/4 plate is combined with a polarizing layer has been proposed as a circularly polarizing film (see, for example, WO2013/137464A).

SUMMARY OF THE INVENTION

On the other hand, a further improvement in the visibility of an image display panel has been required in recent years. Specifically, it is required that coloration is further suppressed in the case of viewing from the front direction, and that the difference in tint between the case of viewing from the front direction and the case of viewing from the oblique direction is smaller.

In addition, in the case where a circularly polarizing film is applied to an image display panel, there is also a requirement for less image unevenness.

The present inventors have examined the characteristics of c circularly polarizing film described in WO2013/137464A and as a result, all of the above requirements could not be satisfied at the same time, and therefore a further improvement was necessary.

The present invention has been made in view of the above circumstances, and an object of the present invention is to provide a phase difference film and a circularly polarizing film, each of which is capable of achieving suppressed coloration in viewing from the front direction, a smaller difference in tint between the case of viewing from the front direction and the case of viewing from the oblique direction, and suppressed image unevenness, in the case where such a film is applied to an image display panel, in particular, an organic EL panel.

It is another object of the present invention to provide an image display device including the circularly polarizing film.

As a result of extensive studies on the problems of the related art, the present inventors have found that the above problems can be solved by using a phase difference film satisfying predetermined optical properties.

That is it has been found that the above-mentioned objects can be achieved by the following configurations.

(1) A phase difference film comprising an optically anisotropic layer A and an optically anisotropic layer B,
 in which a retardation RthA of the optically anisotropic layer A in the thickness direction at a wavelength of 530 nm is larger than 0,
 the optically anisotropic layer A satisfies the relationship of Expressions (A-1) to (A-3),
 a retardation RthB of the optically anisotropic layer B in the thickness direction at a wavelength of 550 nm is smaller than 0,
 the optically anisotropic layer B satisfies the relationship of Expressions (B-1) to (B-3),
 the angle formed between a slow axis of the optically anisotropic layer A and a slow axis of the optically anisotropic layer B is 90°±10°, and
 the phase difference film satisfies the relationship of Expressions (X-1) and (X-2).

| | |
|---|---|
| $0.80 \leq ReA(450)/ReA(550) < 1$. | Expression (A-1) |
| $1 < ReA(650)/ReA(550) \leq 1.30$ | Expression (A-2) |
| $100 \text{ nm} \leq ReA(550) \leq 200 \text{ nm}$ | Expression (A-3) |
| $1.08 \leq ReB(450)/ReB(550) \leq 1.30$ | Expression (B-1) |
| $0.90 \leq ReB(650)/ReB(550) \leq 0.97$ | Expression (B-2) |
| $0 < ReB(550) \leq 50 \text{ nm}$ | Expression (B-3) |
| $0.79 \leq ReX(450)/ReX(550) \leq 0.85$ | Expression (X-1) |
| $1.02 \leq ReX(650)/ReX(550) \leq 1.30$ | Expression (X-2) |

ReA(450), ReA(550), and ReA(650) represent in-plane retardation values of the optically anisotropic layer A at a wavelength of 450 nm, a wavelength of 550 nm, and a wavelength of 650 nm, respectively.

ReB(450), ReB(550), and ReB(650) represent in-plane retardation values of the optically anisotropic layer B at a wavelength of 450 nm, a wavelength of 550 nm, and a wavelength of 650 nm, respectively.

ReX(450), ReX(550), and ReX(650) represent in-plane retardation values of the phase difference film at a wavelength of 4.50 nm, a wavelength of 550 nm, and a wavelength of 650 nm, respectively.

(2) The phase difference film according to (1), further comprising an optically anisotropic layer C having a retardation RthC of smaller than 0 in the thickness direction at a wavelength of 550 nm and satisfying the relationship of Expression (C-1).

| | |
|---|---|
| $0 \leq ReC(550) \leq 10 \text{ nm}$ | Expression (C-1) | in which ReC(550) represents an in-plane retardation value of the optically anisotropic layer Cat a wavelength of 550 nm.

(3) The phase difference film according to (1) or (2), in which the difference between the in-plane retardation ReA (550) of the optically anisotropic layer A at a wavelength of 550 nm and the in-plane retardation ReB(550) of the optically anisotropic layer B at a wavelength of 550 nm is 110 to 170 nm.

(4) A circularly polarizing film comprising the phase difference film according to any one of (1) to (3) and a polarizing layer, in which the angle formed between the slow axis of the optically anisotropic layer A and the absorption axis of the polarizing layer is 45°±10°.

(5) An image display device comprising the circularly polarizing film according to (4).

According to the present invention, it is possible to provide a phase difference film and a circularly polarizing film, each of which is capable of achieving suppressed coloration in viewing from the front direction, a smaller difference in tint between the case of viewing from the front direction and the case of viewing from the oblique direction, and suppressed image unevenness, in the case where such a film is applied to an image display panel, in particular, an organic EL panel.

Further, according to the present invention, it is possible to provide an image display device including the circularly polarizing film.

DESCRIPTION OF THE PREFERRED EMBODIMENTS

Figure 1:
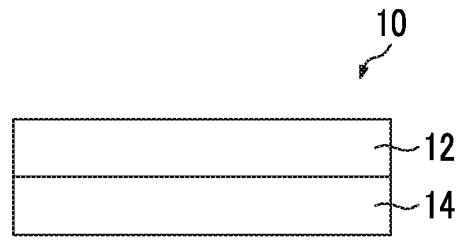
FIG. 1 is a cross-sectional view of one embodiment of a phase difference film of the present invention.

Hereinafter, the present invention will be described in detail. The description of constitution requirements below may be based on representative embodiments of the present invention in some instances, but the present invention is not limited to such embodiments. Meanwhile, in the present specification, the numerical range expressed using "to" refers to a range including numerical values before and after the "to" as the lower limit value and the upper limit value, respectively.

Wordings of "orthogonal" and "parallel" regarding angles are herein interpreted to mean ranges given by (strict angle±10°), and the terminologies of "same" or "different" with respect to an angle may be determined based on whether the difference is smaller than 5° or not.

In the present specification, the term "visible light" refers to a region of 380 to 780 nm. Furthermore, the measurement wavelength is 550 nm, unless otherwise indicated thereon.

In the present specification, the term "slow axis" means a direction in which the refractive index is the maximum in the plane, and the term "circularly polarizing film" is used to mean both a long circularly polarizing film and a circularly polarizing film cut into a size that is incorporated into an image display device unless otherwise specified. The term "cutting" as used herein is also intended to include "punching", "cutting out", and the like.

In the present specification, the term "inclination angle" (also referred to as a tilt angle) means an angle formed between an inclined liquid crystal compound and a plane of layer, and more specifically means the maximum angle among angles formed between the direction of maximum refractive index and the plane of layer in a refractive index ellipsoid of the liquid crystal compound. Accordingly, for a rod-like liquid crystal compound having a positive optical anisotropy, the tilt angle means an angle formed between the long axis direction of the rod-like liquid crystal compound, or the direction of director, and the plane of the layer. In the present invention, the term "average tilt angle (average inclination angle)" means the average value of the tilt angles ranging between the upper interface and the lower interface of the phase difference film.

In the present specification, the term "reciprocal wavelength dispersibility" means a property that the absolute value of in-plane retardation increases as the wavelength becomes longer.

In the present specification, $Re(\lambda)$ and $Rth(\lambda)$ represent an in-plane retardation and a thickness direction retardation at a wavelength $\lambda$, respectively. $Re(\lambda)$ is measured by allowing light having a wavelength of $\lambda$ nm to enter in a film normal direction in KOBRA 21ADH or WR (trade name, manufactured by Oji Scientific Instruments Co., Ltd.).

In the case where a film to be measured is represented by a uniaxial or biaxial index ellipsoid, $Rth(\lambda)$ is calculated by the following method.

$Re(\lambda)$ is measured at 6 points in total by allowing light having a wavelength of $\lambda$ nm to enter from directions respectively inclined in steps of 10° up to 50° on one side from a film normal direction with respect to the normal direction assuming that the in-plane slow axis (determined by KOBRA 21ADH or WR) is an inclined axis (rotational axis) (in the case where there is no slow axis, it is assumed that an arbitrary direction in a film plane is a rotational axis). KOBRA 21ADH or WR calculates the $Rth(\lambda)$ based on the thus measured retardation values, an assumed average refractive index value and an input film thickness value.

In the above, in the case of a film having a direction in which the retardation value is 0 at a predetermined angle inclined from the normal direction assuming that the in-plane slow axis is a rotational axis, the retardation value at a larger inclination angle than the above inclination angle is changed to have a negative sign and then KOBRA 21ADH or WR calculates the $Rth(\lambda)$.

It is also possible to measure retardation values from two arbitrary inclined directions assuming that the slow axis is an inclined axis (rotational axis) (in the case where there is no slow axis, it is assumed that an arbitrary direction in a film plane is a rotational axis), and calculate Rth from Expressions (1) and (2) based on the thus measured retardation values, an assumed average refractive index value and an input film thickness value.

$$Re(\theta) = \left[ nx - \frac{ny \times nz}{\sqrt{\left\{ny \sin\left(\sin^{-1}\left(\frac{\sin(-\theta)}{nx}\right)\right)\right\}^2 + \left\{nz \cos\left(\sin^{-1}\left(\frac{\sin(-\theta)}{nx}\right)\right)\right\}^2}} \right] \times \frac{d}{\cos\left\{\sin^{-1}\left(\frac{\sin(-\theta)}{nx}\right)\right\}} \quad \text{Expression (1)}$$

$$Rth = \left(\frac{nx + ny}{2} - nz\right) \times d \quad \text{Expression (2)}$$

In the expressions, the $Re(\theta)$ represents a retardation value in a direction inclined by an angle $\theta$ from the normal direction. nx represents a refractive index of an in-plane slow axis, ny represents a refractive index in an in-plane direction orthogonal to nx, and nz represents a refractive index in a direction orthogonal to nx and ny. d represents the film thickness of the film.

In the case where a film to be measured cannot be represented by a uniaxial or biaxial index ellipsoid, namely, in the case of a so-called film having no optic axis, $Rth(\lambda)$ is calculated by the following method.

$Re(\lambda)$ is measured at 11 points by allowing A t having a wavelength of λ nm to enter from directions respectively inclined in steps of 10° from −50° to +50° with respect to a film normal direction assuming that the in-plane slow axis (determined by KOBRA 21ADH or WR) is an inclined axis (rotational axis). KOBRA 21ADH or WR calculates the $Rth(\lambda)$ based on the thus measured retardation values, an assumed average refractive index value and an input film thickness value.

In the above measurement, values in Polymer Handbook (John Wiley & Sons, Inc.) and catalogs of various optical films can be used for the assumed average refractive index value. In the case where the average refractive index value is not known, it can be measured by an Abbe refractometer. Average refractive index values of main optical films are illustrated below: cellulose acylate (1.48), cycloolefin polymer (1.52), polycarbonate (1.59), polymethyl methacrylate (1.49), and polystyrene (1.59). These assumed average refractive index values and a film thickness are input to calculate nx, ny, and nz in KOBRA 21ADH or WR. From the thus calculated nx, ny, and nz, Nz=(nx−nz)/(nx−ny) is further calculated.

In the present specification, A-Plate and C-Plate are defined as follows.

There are two types of A-Plate: a positive A-Plate and a negative A-Plate. Assuming that the refractive index of the slow axis in the film plane (direction in which the in-plane refractive index becomes maximum) is nx, the refractive index in the direction orthogonal to the in-plane slow axis is ny, and the refractive index in the thickness direction is nz, the positive A-Plate satisfies the relationship of Expression (A1), and the negative A-Plate satisfies the relationship of Expression (A2). In the positive A-Plate, Rth shows a positive value, and in the negative A-Plate, Rth shows a negative value.

$$nx > ny \approx nz \quad \text{Expression (A1)}$$

$$ny < nx \approx nz \quad \text{Expression (A2)}$$

It should be noted that the above "≈" includes not only a case where the two are completely the same, but also a case where the two are substantially the same. The phrase "substantially the same" means that, for example, a case where (ny−nz)×d (where d is a thickness of the film) is −10 to 10 nm and preferably −5 to 5 nm is also included in "ny≈nz", and a case where (nx−nz)×d is −10 to 10 ran and preferably −5 to 5 nm is also included in "nx≈nz".

There are two types of C-Plate: a positive C-Plate and a negative C-Plate. The positive C-Plate satisfies the relationship of Expression (C1), and the negative C-Plate satisfies the relationship of Expression (C2). In the positive C-Plate, Rth shows a negative value, and in the negative C-Plate, Rth shows a positive value.

$$nz > nx \approx ny \quad \text{Expression (C1)}$$

$$nz < nx \approx ny \quad \text{Expression (C2)}$$

It should be noted that the above "≈" includes not only a case where the two are completely the same, but also a case where the two are substantially the same. The phrase "substantially the same" means that, for example, a case where (nx−ny)×d (where d is a thickness of the film) is 0 to 10 nm and preferably 0 to 5 nm is also included in "nx≈ny".

In the phase difference film of the present invention, desired effects can be obtained by including an optically anisotropic layer exhibiting predetermined optical properties. More specifically, as will be described later in detail, the optically anisotropic layer A is an optically anisotropic layer exhibiting so-called reciprocal wavelength dispersibility, and the optically anisotropic layer B is an optically anisotropic layer exhibiting so-called forward wavelength dispersibility, and desired effects can be obtained by laminating both optically anisotropic layers. The present inventors have found that image unevenness is related to the planar properties of the phase difference film. Due to its optical properties, the optically anisotropic layer used in the present phase difference film can be made thinner than a conventional broadband λ/4 plate obtained by laminating a λ/4 plate and a λ/2 plate. As a result, it is presumed that the planar properties are improved and image unevenness is suppressed.

Hereinafter, one embodiment of the phase difference film of the present invention will be described with reference to the accompanying drawings. FIG. 1 shows a cross-sectional view of one embodiment of the phase difference film of the present invention. It should be noted that the drawings in the present invention are schematic diagrams, and the relationship of the thickness of each layer, the positional relationship therebetween, and the like do not necessarily agree with actual ones. The same applies to the following figures.

A phase difference film 10 includes an optically anisotropic layer A (12) and an optically anisotropic layer B (14). As will be described later in detail, the phase difference film 10 as a whole has characteristics of a so-called λ/4 plate (a phase difference film expressing a ¼ phase difference value for light of each wavelength).

Hereinafter, individual members included in the phase difference film will be described in detail. Hereinafter, the phase difference film will first be described in detail.

The phase difference film is a laminate including at least an optically anisotropic layer A and an optically anisotropic layer B.

Hereinafter, each layer constituting the phase difference film will be described in detail.

<Optically Anisotropic Layer A>

The optically anisotropic layer A is an optically anisotropic layer having a retardation RthA in the thickness direction at a wavelength of 550 nm showing a positive value and satisfying the relationship of Expressions (A-1) to (A-3). It is preferred that the optically anisotropic layer A corresponds to a so-called positive A-Plate.

The retardation RthA of the optically anisotropic layer A in the thickness direction at a wavelength of 550 nm is larger than 0. It indicates a so-called positive Rth.

It is sufficient that the value of RthA is positive. From the viewpoint that the display performance of an image display device is excellent, in particular, the difference in tint between the case of viewing from the front direction and the case of viewing from the oblique direction is smaller (that is, the viewing angle characteristics are excellent), the value of RthA is preferably more than 0 nm and 120 nm or less and more preferably 30 to 100 nm.

The optically anisotropic layer A satisfies the relationship of Expressions (A-1) to (A-3).

$$0.80 \leq ReA(450)/ReA(550) < 1. \quad \text{Expression (A-1)}$$

$$1 < ReA(650)/ReA(550) \leq 1.30 \quad \text{Expression (A-2)}$$

$$100 \text{ nm} \leq ReA(550) \leq 200 \text{ nm} \quad \text{Expression (A-3)}$$

ReA(450), ReA(550), and ReA(650) represent in-plane retardation values of the optically anisotropic layer A at a wavelength of 450 nm, a wavelength of 550 nm, and a wavelength of 650 nm, respectively.

In particular, from the viewpoint of satisfying at least one of that coloration in the case where an image display device having a circularly polarizing film including the present phase difference film. is viewed from the front direction is further suppressed, and that the difference in tint between the cases where the image display device is viewed from the front direction and oblique direction is smaller (hereinafter, also simply referred to as "the effects of the present invention are excellent"), the optically anisotropic layer A preferably satisfies Expression (A-1-1) and more preferably satisfies Expression (A-1-2).

$$0.82 \leq ReA(450)/ReA(550) \leq 0.96 \quad \text{Expression (A-1-1)}$$

$$0.84 \leq ReA(450)/ReA(550) \leq 0.92 \quad \text{Expression (A-1-2)}$$

Further, from the viewpoint that the effects of the present invention are excellent, the optically anisotropic layer A preferably satisfies Expression (A-2-1) and more preferably satisfies Expression (A-2-2).

$$1 < ReA(650)/ReA(550) \leq 1.25 \quad \text{Expression (A-2-1)}$$

$$1 < ReA(650)/ReA(550) \leq 1.20 \quad \text{Expression (A-2-2)}$$

Further, from the viewpoint that the effects of the present invention are excellent, the optically anisotropic layer A preferably satisfies Expression (A-3-1) and more preferably satisfies Expression (A-3-2).

$$120 \text{ nm} \leq ReA(550) \leq 200 \text{ nm} \quad \text{Expression (A-3-1)}$$

$$140 \text{ nm} \leq ReA(550) \leq 190 \text{ nm} \quad \text{Expression (A-3-2)}$$

The thickness of the optically anisotropic layer A is not particularly limited, but it is preferably 0.1 to 80 μm and more preferably 0.1 to 70 μm from the viewpoint of thinning.

The thickness is intended to mea an average thickness which is calculated in such a manner that the thickness of the optically anisotropic layer A at five arbitrary points thereof is measured and the arithmetic average of the obtained values is calculated.

The optically anisotropic layer A preferably contains a liquid crystal compound, More specifically, the optically anisotropic layer A preferably corresponds to a layer containing a homogeneously aligned rod-like liquid crystal compound. The term "homogeneously aligned" refers to an alignment state in which the long axis direction formed by the rod-like liquid crystal compound is parallel to the plane. However, the optically anisotropic layer A may be formed of another material as long as it satisfies predetermined properties such as the in-plane retardation value described above. For example, it may be formed of a polymer film (in particular, a polymer film subjected to a stretching treatment).

More specifically, the optically anisotropic layer A may be, for example, an optically anisotropic layer obtained by forming a low-molecular-weight liquid crystal compound to be nematic-aligned in a liquid crystal state and then immobilizing the low-molecular-weight liquid crystal compound through photocrosslinking or thermal crosslinking or an optically anisotropic layer obtained by forming a high-molecular-weight liquid crystal compound to be nematic-aligned in a liquid crystal state and then immobilizing the alignment by cooling the high-molecular-weight liquid crystal compound. Meanwhile, in the present invention, the optically anisotropic layer is, for example, a layer formed of the liquid crystal compound being immobilized through polymerization or the like, and, once the layer is formed, the optically anisotropic layer does not need to exhibit liquid crystallinity any longer.

Generally, the liquid crystal compound may be classified into a rod shape-type (rod-like liquid crystal compound) and a disc-type (discotic liquid crystal compound, or disc-like liquid crystal compound) depending on the shape thereof. Furthermore, there are a low-molecular-weight liquid crystal compound and a high-molecular-weight liquid crystal compound, respectively. The high-molecular-weight compound generally refers to a compound having a degree of polymerization of 100 or higher (Polymer Physics and Phase Transition Dynamics, Masao Doi, p. 2, Iwanami Shoten, Publishers, 1992). In the present invention, any liquid crystal compound may be used. Two or more rod-like liquid crystal compounds, two or more discotic liquid crystal compounds, or a mixture of a rod-like liquid crystal compound and a discotic liquid crystal compound may be used.

As the rod-like liquid crystal compound, for example, the rod-like liquid crystal compound described in JP1999-513019A (JP-H11-513019A) or JP2007-279688A may be preferably used. As the discotic liquid crystal compound, for example, the discotic liquid crystal compound described in JP2007-108732A or JP2010-2414038A may be preferably used, but the liquid crystal compound is not limited thereto.

In particular, it is preferred that, in the optically anisotropic layer A, a rod-like liquid crystal compound is included, and the long axis of the rod-like liquid crystal compound is substantially horizontal to the film plane (optically anisotropic layer plane). The phrase "rod-like liquid crystal compound is substantially horizontal" refers to that the angle formed between the transparent support plane (optically anisotropic layer B plane) and the director of the rod-like liquid crystal compound is within the range of 0° to 20°, more preferably 0° to 10° and still more preferably 0° to 5°.

The optically anisotropic layer A is more preferably formed using a liquid crystal compound (a rod-like liquid crystal compound or a discotic liquid crystal compound) having a reactive group (preferably a polymerizable group), from the viewpoint that the temperature-dependent changes and/or humidity-dependent changes of optical properties can be reduced. The number of reactive groups in the liquid crystal compound is not particularly limited, but it is preferably two or more. Further, the liquid crystal compound may be a mixture of two or more thereof.

In other words, the optically anisotropic layer A is preferably a layer formed by immobilizing a polymerizable liquid crystal compound (a rod-like liquid crystal compound having a polymerizable group or a discotic liquid crystal compound having a polymerizable group) by means of polymerization.

The type of the polymerizable group contained in the rod-like liquid crystal compound or the discotic liquid crystal compound is not particularly limited, and a functional group capable of addition polymerization reaction is preferable and a polymerizable ethylenically unsaturated group or a cyclic polymerizable group is preferable. More specifically, a (meth)acryloyl group, a vinyl group, a styryl group, or an allyl group is preferable, and a (meth)acryloyl group is more preferable. The term "(meth)acryloyl group" is a concept encompassing both a methacryloyl group and an acryloyl group.

One suitable embodiment of the liquid crystal compound contained in the optically anisotropic layer A may be, for example, a compound represented by General Formula (I).

    General Formula (I)

In the formula $D_1$ and $D_2$, each independently represent —CO—O—, —O—CO—, —C(=S)O—, —O—C(=S)—, —$CR^1R^2$—, —$CR^1R^2$—$CR^3R^4$—, —O—$CR^1R^2$—, —$CR^1R^2$—O—, —$CR^1R^2$—O—$CR^3R^4$—, —$CR^1R^2$—O—CO—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, —$CR^1R^2$—$NR^3$—, —CO—$NR^1$—, or —$NR^1$—CO—, $R^1$, $R^2$, $R^3$, and $R^4$ each independently represent a hydrogen atom, a halogen atom, or an alkyl group having 1 to 4 carbon atoms, $G_1$ and $G_2$ each independently represent a divalent alicyclic hydrocarbon group having 5 to 8 carbon atoms, and the methylene group contained in the alicyclic hydrocarbon group may be substituted by —O—, —S—, or —$N(R^6)$— where $R^6$ represents a hydrogen atom or an alkyl group having 1 to 6 carbon atoms, $L_1$ and $L_2$ each independently represent a monovalent organic group, and at least one selected from the group consisting of $L_1$ and $L_2$ represents a monovalent group having a polymerizable group, and Ar represents a divalent aromatic ring group represented by General Formula (II-1), (II-2), (II-3), or (II-4).

General Formula

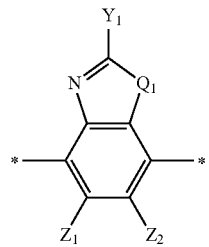    (II-1)

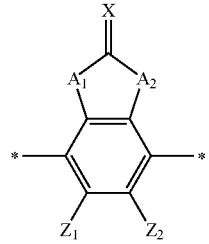    (II-2)

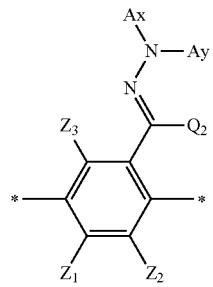    (II-3)

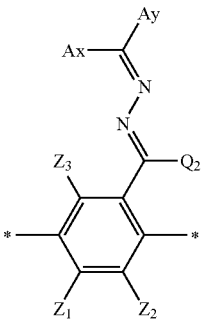    (II-4)

In General Formulae (II-1) to (II-4), $Q_1$ represents —S—, —O—, or $NR^{11}$— where $R^{11}$ represents a hydrogen atom or an alkyl group having 1 to 6 carbon atoms, $Y_1$ represents an aromatic hydrocarbon group having 6 to 12 carbon atoms or an aromatic heterocyclic group having 3 to 12 carbon atoms, $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —$NR^{12}R^{13}$, or $SR^{12}$, $Z_1$ and $Z_2$ may be bonded to each other to form an aromatic ring or an aromatic heterocyclic ring, and $R^{12}$ and $R^{13}$ each independently represent a hydrogen atom or an alkyl group having 1 to 6 carbon atoms, $A_1$ and $A_2$ each independently represent a group selected from the group consisting of —O—, —$NR^{21}$— represents a hydrogen atom or a substituent), —S—, and —CO—, and X represents a non-metal atom of Groups XIV to XVI to which a hydrogen atom or a substituent may be bonded, Ax represents an organic group having 2 to 30 carbon atoms and having at least one aromatic ring selected from the group consisting of an aromatic hydrocarbon ring and an aromatic heterocyclic ring, Ay represents a hydrogen atom, an alkyl group having 1 to 6 carbon atoms which may have a substituent, or an organic group having 2 to 30 carbon atoms and having at least one aromatic ring selected from the group consisting of an aromatic hydrocarbon ring and an aromatic heterocyclic ring, the aromatic ring contained in Ax and Ay may have a substituent, and Ax and Ay may be bonded to each other to form a ring, and $Q_2$ represents a hydrogen atom or an alkyl group having 1 to 6 carbon atoms which may have a substituent.

As for definitions and preferred ranges of the individual substituents of the compound represented by General Formula (I), $D_1$, $D_2$, $G_1$, $G_2$, $L_1$, $L_2$, $R^1$, $R^2$, $R^3$, $R^4$, $X^1$, $Y^1$, $Z_1$, and $Z_2$ may be referred respectively to the description on $D^1$, $D^2$, $G^1$, $G^2$, $L^1$, $L^2$, $R^1$, $R^2$, $R^3$, $R^4$, $X^1$, $Y^1$, $Q^1$, and $Q^2$ of Compound (A) in JP2012-21068A; $A_1$, $A_2$, and X may be referred to the description on $A_1$, $A_2$, and X of the compound represented by General Formula (I) in JP2008-107767A; Ax, Ay, and $Q_2$ may be referred to the description on Ax, Ay, and $Q^1$ of the compound represented by General Formula (I) in WO2013/018526A; and $Z_3$ may be referred to the description on $Q^1$ of Compound (A) in JP2012-21068A.

In particular, the organic group represented by each of $L_1$ and $L_2$ is preferably a group represented by -$D_3$-$G_3$-Sp-$P_3$. $D_3$ has the same definition as $D_1$; $G_3$ represents a single bond, a divalent aromatic ring group or heterocyclic group having 6 to 12 carbon atoms, or a divalent alicyclic hydrocarbon group having 5 to 8 carbon atoms; the methylene group contained in the alicyclic hydrocarbon group may be substituted by —O—, —S—, —NR$^7$— where R$^7$ represents a hydrogen atom or an alkyl group having 1 to 6 carbon atoms; Sp represents a single bond, or a spacer group represented by —(CH$_2$)$_n$—, —(CH$_2$)$_n$—O—, —(CH$_2$—O—)$_n$—, —(CH$_2$CH$_2$—O—)$_m$, —O—(CH$_2$)$_n$—, —O—(CH$_2$)$_n$—O—, —O—(CH$_2$—O—)$_n$—, —O—(CH$_2$CH$_2$—O—)$_m$, —C(=O)—O—(CH$_2$)$_n$—, —C(=O)—O—(CH$_2$)$_n$—O—, —C(=O)—O—(CH$_2$—O—)$_n$—, —C(=O)—O—(CH$_2$CH$_2$—O—)$_m$, —C(=O)—N(R$^8$)—(CH$_2$)$_n$—, —C(=O)—N(R$^8$)—(CH$_2$)$_n$—O—, —C(=O)—N(R$^8$)—(CH$_2$—O—)$_n$—, or —C(=O)—N(R$^8$)—(CH$_2$CH$_2$—O—)$_m$ where n represents an integer of 2 to 12, m represents an integer of 2 to 6, and R$^8$ represents a hydrogen atom or an alkyl group having 1 to 6 carbon atoms; and P$_3$ represents a polymerizable group.

The polymerizable group is not particularly limited, but it is preferably a polymerizable croup capable of radical polymerization or cationic polymerization. A generally known radically polymerizable group can be used as the radically polymerizable group, and suitable examples thereof include an acryloyl group and a methacryloyl group. in this case, it is known that an acryloyl group exhibits a generally fast polymerization rate, and an acryloyl group is preferable from the viewpoint of productivity improvement, but a methacryloyl group can also be used as a polymerizable group of a highly birefringent liquid crystal. A generally known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among them, an alicyclic ether group or a vinyloxy group is preferable, and an epoxy group, an oxetanyl group, or a vinyloxy group is particularly preferable.

Examples of particularly preferred polymerizable groups include the following.

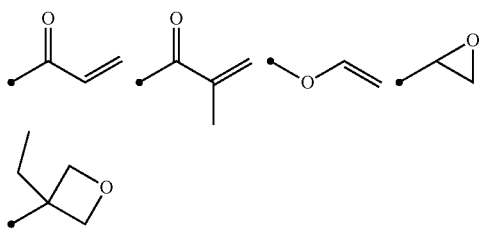

Another suitable embodiment of the liquid crystal compound contained in the optically anisotropic layer A may also be, for example, the polymerizable compound described in WO2012/147904A.

The method for forming the optically anisotropic layer A is not particularly limited, and a known method may be mentioned.

For example, the optically anisotropic layer A can be produced by applying a composition for forming an optically anisotropic layer containing a liquid crystal. compound having a polymerizable group (hereinafter, also simply referred to as "composition") onto a predetermined substrate (including a temporary substrate) to form a coating film, and subjecting the resulting coating film to a curing treatment (irradiation with ultraviolet light (light irradiation treatment) or a heat treatment). Further, an alignment film to be described later may be used as necessary.

The composition can be applied by a known method (for example, a wire bar coating method, an extrusion coating method, a direct gravure coating method, an reverse gravure coating method, or a die-coating method).

The composition may contain components other than the liquid crystal compound described above.

For example, the composition may contain a polymerization initiator. The polymerization initiator to be used is selected according to the type of polymerization reaction, and examples thereof include a thermal polymerization initiator and a photopolymerization initiator. Examples of the photopolymerization initiator include an α-carbonyl compound, an acyloin ether, an α-hydrocarbon substituted aromatic acyloin compound, a polynuclear quinone compound, and a combination of a triarylimidazole dimer and p-aminophenyl ketone.

The amount of the polymerization initiator used is preferably 0.01 to 20 mass % and more preferably 0.5 to 5 mass %, with respect to the total solid content of the composition, In addition, the composition may contain a polymerizable monomer from the viewpoint of uniformity of the coated film and hardness of the film.

The polymerizable monomer may be, for example, a radically polymerizable or cationically polymerizable compound, and it is preferably a polyfunctional radically polymerizable monomer, which is preferably copolymerizable with the above-mentioned polymerizable group-containing liquid crystal compound. Examples of the polymerizable monomer include those described in paragraphs [0018] to [0020] of JP2002-296423A.

The amount of the polymerizable monomer used is preferably 1 to 50 mass % and more preferably 2 to 30 mass %, with respect to the total mass of the liquid crystal compound.

Further, the composition may contain a surfactant from the viewpoint of the uniformity of the coated film and the hardness of the film.

The surfactant may be, for example, a conventional known compound, among which a fluorine-based compound is particularly preferable. Specific examples of the surfactant include the compounds described in paragraphs [0028] to [0056] of JP2001-330725A and the compounds described in paragraphs [0069] to [0126] of JP2003-295212.

Further, the composition may contain a solvent. An organic solvent is preferably used. Examples of the organic solvent include an amide (for example, N,N-dimethylformamide), a sulfoxide (for example, dimethyl sulfoxide), a heterocyclic compound (for example, pyridine), a hydrocarbon (for example, benzene or hexane), an alkyl halide (for example, chloroform or dichloromethane), an ester (for example, methyl acetate, ethyl acetate, or butyl acetate), a ketone (for example, acetone or methyl ethyl ketone), and an ether (for example, tetrahydrofuran or 1,2-dimethoxyethane). Among them, an alkyl halide or a ketone is preferable. Two or more organic solvents may be used in combination.

Further, the composition may contain various alignment agents such as a vertical alignment accelerator and a horizontal alignment accelerator.

Further, the composition may contain an adhesion improver, a plasticizer, a polymer or the like in addition to the foregoing components.

<Optically Anisotropic Layer B>

The optically anisotropic layer B is an optically anisotropic layer having a retardation RthB of smaller than 0 in the thickness direction at a wavelength of 550 nm and satisfying the relationship of Expressions (B-1) to (B-3). It is preferred that the optically anisotropic layer B corresponds to a so-called negative A-Plate.

The retardation RthB of the optically anisotropic layer B in the thickness direction at a wavelength of 550 nm is smaller than 0. It indicates a so-called negative Rth.

It is sufficient that the value of RthB is negative. From the viewpoint that the display performance (in particular, viewing angle characteristics) of an image display device is excellent, the value of RthB is preferably −80 nm or more and less than 0 nm and more preferably −50 to −5 nm.

The optically anisotropic layer B satisfies the relationship of Expressions (B-1) to (B-3).

$$1.08 \leq \text{Re}B(450)/\text{Re}B(550) \leq 1.30 \quad \text{Expression (B-1)}$$

$$0.90 \leq \text{Re}B(650)/\text{Re}B(550) \leq 0.97 \quad \text{Expression (B-2)}$$

$$0 < \text{Re}B(550) \leq 50 \text{ nm} \quad \text{Expression (B-3)}$$

ReB(450), ReB(550), and ReB(650) represent in-plane retardation values of the optically anisotropic layer B at a wavelength of 450 nm, a wavelength of 550 nm, and a wavelength of 650 nm, respectively.

In particular, from the viewpoint that the effects of the present invention are excellent, the optically anisotropic layer B preferably satisfies Expression (B-1-1) and more preferably satisfies Expression (B-1-2).

$$1.10 \leq \text{Re}B(450)/\text{Re}B(550) \leq 1.30 \quad \text{Expression (B-1-1)}$$

$$1.12 \leq \text{Re}B(450)/\text{Re}B(550) \leq 1.30 \quad \text{Expression (B-1-2)}$$

Further, from the viewpoint that the effects of the present invention are excellent, the optically anisotropic layer B preferably satisfies Expression (B-2-1) and more preferably satisfies Expression (B-2-2).

$$0.90 \leq \text{Re}B(650)/\text{Re}B(550) \leq 0.96 \quad \text{Expression (B-2-1)}$$

$$0.90 \leq \text{Re}B(650)/\text{Re}B(550) \leq 0.95 \quad \text{Expression (B-2-2)}$$

Further, from the viewpoint that the effects of the present invention are excellent, the optically anisotropic layer B preferably satisfies Expression (B-3-1) and more preferably satisfies Expression (B-3-2).

$$5 \leq \text{Re}B(550) \leq 50 \text{ nm} \quad \text{(B-3-1)}$$

$$10 \leq \text{Re}B(550) \leq 50 \text{ nm} \quad \text{Expression (B-3-2)}$$

The thickness of the optically anisotropic layer B is not particularly limited, but it is preferably 0.05 to 10 μm and more preferably 0.1 to 5 μm from the viewpoint of thinning.

The thickness is intended to mean an average thickness which is calculated in such a manner that the thickness of the optically anisotropic layer B at five arbitrary points thereof is measured and the arithmetic average of the obtained values is calculated.

As a material constituting the optically anisotropic layer B, a liquid crystal compound can be mentioned. Exemplary liquid crystal compounds are as described above.

In particular, it is preferred that, in the optically anisotropic layer B, a discotic liquid crystal compound is included, and the disc plane of the discotic liquid crystal compound is substantially perpendicular to the film plane (optically anisotropic layer plane). In other words, the optically anisotropic layer B is preferably a layer containing a discotic liquid crystal compound that has been substantially vertically aligned, from the viewpoint that the display performance of an image display device is excellent.

Further, similarly to the above-mentioned optically anisotropic layer A, the optically anisotropic layer B is more preferably formed using a liquid crystal compound (a rod-like liquid crystal compound or a discotic liquid crystal compound) having a reactive group (preferably a polymerizable group), from the viewpoint that the temperature-dependent changes and/or humidity-dependent changes of optical properties can be reduced. In other words, the optically anisotropic layer B is preferably a layer formed by immobilizing a polymerizable liquid crystal compound (a rod-like liquid crystal compound having a polymerizable group or a discotic liquid crystal compound having a polymerizable group) by means of polymerization.

The procedure for producing the layer is the same as the optically anisotropic layer A described above.

<Optional Layer>

The phase difference film may include layers other than the optically anisotropic layer A and the optically anisotropic layer B described above.

Figure 2:
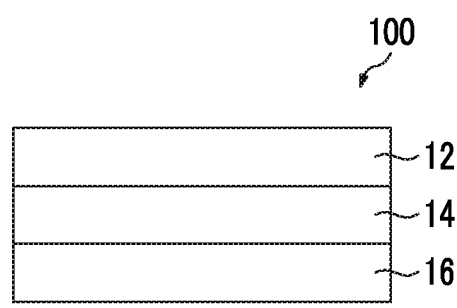
FIG. 2 is a cross-sectional view of another embodiment of the phase difference film of the present invention.

For example, as shown in FIG. 2, a phase difference film 100 may include an optically anisotropic layer C (16) in the subsequent section. In FIG. 2, the optically anisotropic layer C (16) is arranged at the lowermost side on the drawing, but the arrangement position thereof is not particularly limited and may be between an optically anisotropic layer A (12) and an optically anisotropic layer B (14) or on the surface of the optically anisotropic layer A (12) opposite to the optically anisotropic layer B (14) side.

(Optically Anisotropic Layer C)

In the optically anisotropic layer C, the retardation RthC in the thickness direction at a wavelength of 550 nm is smaller than 0. It indicates a so-called negative Rth.

It is sufficient that the value of RthC is negative. From the viewpoint that the display performance (in particular, viewing angle characteristics) of an image display device is excellent, the value of RthC is preferably −150 nm or more and less than 0 nm, and more preferably −100 to −20 nm.

In the optically anisotropic layer C, the in-plane retardation ReC(550) at a wavelength of 550 nm satisfies the relationship of Expression (C-1).

$$0 \leq \text{Re}C(550) \leq 10 \text{ nm} \quad \text{Expression (C-1)}$$

In particular, from the viewpoint that the effects of the present invention are excellent, the optically anisotropic layer C preferably satisfies the relationship of Expression (C-2).

$$0 \leq \text{Re}C(550) \leq 5 \text{ nm} \quad \text{Expression (C-2)}$$

The thickness of the optically anisotropic layer C is not particularly limited, but it is preferably 0.05 to 10 μm and more preferably 0.1 to 5 μm from the viewpoint of thinning.

The thickness is intended to mean an average thickness which is calculated in such a manner that the thickness of the optically anisotropic layer C at five arbitrary points thereof is measured and the arithmetic average of the obtained values is calculated.

The optically anisotropic layer C is preferably formed of a composition containing a liquid crystal compound. The definition of the liquid crystal compound is as described above.

Further, similarly to the above-mentioned optically anisotropic layer A, the optically anisotropic layer C is more preferably formed using a liquid crystal compound (a rod-like liquid crystal compound or a discotic liquid crystal compound) having a reactive group (preferably a polymerizable group), from the viewpoint that the temperature-dependent changes and/or humidity-dependent changes of optical properties can be reduced. In other words, the optically anisotropic layer C is preferably a layer formed by immobilizing a polymerizable liquid crystal compound (a rod-like liquid crystal compound having a polymerizable group or a discotic liquid crystal compound having a polymerizable group) by means of polymerization.

The procedure for producing the layer is the same as the optically anisotropic layer A described above.

(Other Layers)

For example, the phase difference film may include an alignment film having a function of defining the alignment direction of a liquid crystal compound.

The alignment film is generally formed of a polymer as a main component. Polymer materials for an alignment film are described in many documents and a large number of commercially available products can be obtained. The polymer material to be used is preferably polyvinyl alcohol or polyimide, and derivatives thereof. Particularly preferred is modified or unmodified polyvinyl alcohol. Regarding the alignment film usable in the present invention, reference may be made to the modified polyvinyl alcohols described in WO01/88574A1, from page 43, line 24 to page 49, line 8, and paragraphs [0071] to [0095] of JP39077358. The alignment film is usually subjected to a known rubbing treatment. That is, usually, the alignment film is preferably a rubbed alignment film which has been subjected to a rubbing treatment.

The thickness of the alignment film is not particularly limited, but it is preferably 0.01 to 10 μm, more preferably 0.01 to 1 μm, and still more preferably 0.01 to 0.8 μm.

in order to ensure adhesiveness between the layers, a pressure sensitive adhesive layer or an adhesive layer may be disposed therebetween.

<Phase Difference Film>

The phase difference film including the optically anisotropic layer A and the optically anisotropic layer B satisfies the relationship of Expressions (X-1) and (X-2).

$$0.79 \leq ReX(450)/ReX(550) \leq 0.85 \quad \text{Expression (X-1)}$$

$$1.02 \leq ReX(650)/ReX(550) \leq 1.30 \quad \text{Expression (X-2)}$$

ReX(450), ReX(550), and ReX(650) represent in-plane retardation values of the phase difference film at a wavelength of 450 nm, a wavelength of 550 nm, and a wavelength of 650 nm, respectively.

In particular, from the viewpoint that the effects of the present invention are excellent, the phase difference film preferably satisfies Expression (X-1-1) and more preferably satisfies Expression (X-1-2).

$$0.80 \leq ReX(450)/ReX(550) \leq 0.84 \quad \text{Expression (X-1-1)}$$

$$0.81 \leq ReX(450)/ReX(550) \leq 0.83 \quad \text{Expression (X-1-2)}$$

In particular, from the viewpoint that the effects of the present invention are excellent, the phase difference film preferably satisfies Expression (X-2-1) and more preferably satisfies Expression (X-2-2).

$$1.02 \leq ReX(650)/ReX(550) \leq 1.27 \quad \text{Expression (X-2-1)}$$

$$1.02 \leq ReX(650)/ReX(550) \leq 1.24 \quad \text{Expression (X-2-2)}$$

As represented by Expressions (X-1) and (X-2), as a feature of the phase difference film, first, the in-plane retardation of the phase difference film has a relationship of ReX(450)<ReX(550)<ReX(650). That is, the phase difference film exhibits reciprocal wavelength dispersibility with respect to in-plane retardation.

In the phase difference film, the angle formed between the slow axis (slow axis direction) of the optically anisotropic layer A and the slow axis (slow axis direction) of the optically anisotropic layer B is 90°±10°, and it is preferably 90°±8° and more preferably 90°±5°, from the viewpoint that the effects of the present invention are excellent.

The retardation of the phase difference film in the thickness direction at a wavelength of 550 nm is not particularly limited, but it is preferably −80 to 100 nm and more preferably −40 to 80 nm, from the viewpoint that the effects of the present invention are excellent.

In the phase difference film, the difference between the in-plane retardation ReA(550) of the optically anisotropic layer A at a wavelength of 550 nm and the in-plane retardation ReB(550) of the optically anisotropic layer B at a wavelength of 550 nm (ReA(550)−ReB(550)) is preferably 110 to 170 nm and more preferably 120 to 160 nm, from the viewpoint that the effects of the present invention are excellent.

<Circularly Polarizing Film>

The circularly polarizing film of the present invention has the phase difference film the polarizing layer described above.

Figure 3:
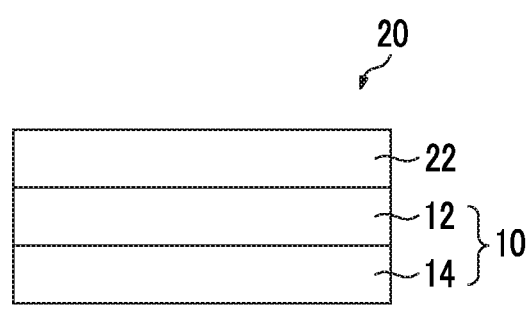
FIG. 3 is a cross-sectional view of one embodiment of a circularly polarizing film of the present invention.

More specifically, as shown in FIG. 3, a circularly polarizing film 20 has a phase difference film 10 and a polarizing layer 22. In FIG. 3, individual optically anisotropic layers are arranged in the order of an optically anisotropic layer A (12) and an optically anisotropic layer B (14) from the side of the polarizing layer 22 in the phase difference film 10, but the arrangement order of the optically anisotropic layers is not limited to this configuration. For example, the optically anisotropic layer B and the optically anisotropic layer A may be arranged in this order from the polarizing layer side.

In addition, the angle formed between the slow axis (slow axis direction) of the optically anisotropic. layer A and the absorption axis (absorption axis direction) of the polarizing layer is 45°±10°, and it is preferably 45°±8° and more preferably 45°±5° from the viewpoint that the effects of the present invention are excellent.

The configuration of the phase difference film is as described above.

Hereinafter, the polarizing layer will be described in detail.

(Polarizing Layer)

The polarizing layer (polarizing film) may be a so-called linear polarizer (linear polarizing layer) having, a function of converting natural light into specific linearly polarized light. The polarizing layer is not particularly limited, and an absorptive polarizer (absorptive polarizing layer) can be used.

There is no particular limitation on the type of the polarizing layer, and a commonly used polarizing layer can be used. Examples of the polarizing layer that can be used in the present invention include an iodine-containing polarizing film, a dye-containing polarizing film utilizing a dichroic dye (dichroic organic dye), and a polyene-containing polarizing film. The iodine-containing polarizing film and the dye-containing polarizing film are generally prepared by adsorbing iodine or a dichroic dye on polyvinyl alcohol, followed by stretching.

The film thickness of the polarizing layer is not particularly limited, but it is preferably 50 μm or less, more preferably 30 μm or less, and still more preferably 20 μm or less, from the viewpoint of thinning. The film thickness of the polarizing layer is usually 1 μm or more and preferably 5 μm or more.

(Transparent Protective Film)

Figure 4:
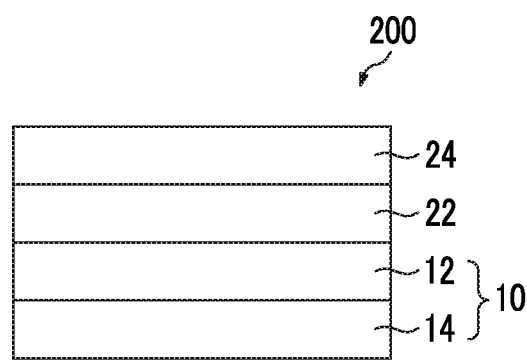
FIG. 4 is a cross-sectional view of another embodiment of the circularly polarizing film of the present invention.

The circularly polarizing film of the present invention may further have a transparent protective film. More specifically, as shown in FIG. 4, a circularly polarizing film 200 includes a phase difference film 10, a polarizing layer 22, and a transparent protective film 24. As shown in FIG. 4, it is preferred that the transparent protective film 24 is arranged on the surface of the polarizing layer 22 opposite to the phase difference film 10 side.

The type of the transparent protective film is not particularly limited and may be, for example, a so-called transparent resin support, a hard coat layer, or a laminate of a transparent resin support and a hard coat layer. The transparent protective film is preferably a laminate including a transparent resin support and a hard coat layer.

A known transparent resin support may be used as the transparent resin support. As the material forming the transparent resin support, for example, a cellulose-based polymer typified by triacetylcellulose, a thermoplastic norbornene-based resin (ZEONEX or ZEONOR manufactured by Zeon Corporation, ARTON manufactured by JSR Corporation, or the like), an acrylic resin, or a polyester-based resin may be used.

The transparent protective film may be bonded to the polarizing layer through a pressure sensitive adhesive layer or an adhesive layer.

The circularly polarizing film may include layers other than the phase difference film, the polarizing layer, and the transparent protective film described above. For example, a functional layer may be further included.

Examples of the functional layer include an antireflection layer and an antiglare layer. Known layer materials are used for forming these layers. A plurality of these layers may be laminated.

The thickness (overall thickness) of the circularly polarizing film is not particularly limited, but it is preferably 100 μm or less. From the viewpoint of further thinning a device, the thickness of the circularly polarizing film is preferably 80 μm or less. The lower limit of the thickness of the circularly polarizing film is not particularly limited, but it is usually 20 μm or more in many cases.

The above-mentioned thickness is intended to mean an average thickness which is calculated in such a manner that the thickness of the circularly polarizing film at five arbitrary points thereof is measured and the arithmetic average of the obtained values is calculated.

The circularly polarizing film can be applied for various applications. In particular, the circularly polarizing film can be suitably used as an antireflection plate. That is, the image display device of the present Invention has an image display panel and the circularly polarizing film of the present invention as an antireflection layer on the image display panel. The circularly polarizing film is arranged on the viewing side of the image display panel.

The image display panel in the image display device is not particularly limited and may be, for example, a liquid crystal display panel including a liquid crystal layer, an organic EL panel (organic EL display panel) including an organic EL layer, or a plasma display panel.

For example, an antireflection plate made of the circularly polarizing film of the present invention, can be used on the light extraction side of an organic EL display device. In this case, the organic EL display device includes a circularly polarizing film and an organic EL panel (organic EL element), with the polarizing layer, the phase difference film, and the organic EL panel being arranged in this order from the viewing side.

In this embodiment, the external light becomes linearly polarized light by the polarizing layer, and then passes through the phase difference film to become circularly polarized light. in the case where the circularly polarized light is reflected by a metal electrode or the like of the organic EL panel, the circularly polarized state thereof is inversed, and in the case where the circularly polarized light passes again through the phase difference film, it becomes linearly polarized light inclined by 90° from the incidence, reaches the polarizing layer and is then absorbed therein. As a result, the influence of external light can be suppressed, In the case of producing the antireflection plate, it is preferable to include, for example, a step of successively laminating the phase difference film and the polarizing layer in a lengthwise manner, respectively. The long antireflection plate is cut according to a size of a screen of an image display device to be used.

EXAMPLES

Hereinafter, the features of the present invention will be described in more detail with reference to Examples and Comparative Examples. The materials, the used amount, the ratio, the contents of a treatment, and the procedures of a treatment described in Examples below may be appropriately modified without departing from the spirit of the present invention. Accordingly, the scope of the present invention should not be (imitatively interpreted by the specific examples described below.

Example 1

<Preparation of Reciprocal Wavelength Dispersible Optically Anisotropic Layer (X)>

(Formation of Alignment Film A)

An elongated cellulose acylate film (TD80UL, manufactured by FUJIFILM Corporation) was passed through a dielectric type heating roll at a temperature of 60° C., and the surface temperature of the cellulose acylate film was increased to 40° C. Thereafter, an alkaline solution having the composition shown below was applied onto the band surface of the cellulose acylate film at a coating amount of 14 ml/m$^2$ using a bar coater. Next, the cellulose acylate film coated with an alkaline solution was conveyed for 10 seconds under a steam type far infrared heater manufactured by Noritake Co., Ltd. which was heated to 110° C. Subsequently, using the same bar coater, pure water was applied to the obtained cellulose acylate film at an amount of 3 ml/m$^2$. Next, water washing with a fountain coater and draining, with an air knife were repeated three times on the resulting, cellulose acylate film. Thereafter, the obtained cellulose acylate film was conveyed and dried in a drying zone at 70° C. for 10 seconds to prepare a cellulose acylate film subjected to an alkali saponification treatment.

Composition of Alkaline Solution

| | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

On the surface of the cellulose acylate film subjected to an alkali saponification treatment, an alignment film A coating liquid having the following composition was continuously applied with a #14 wire bar. Next, the cellulose acylate film coated with an alignment film A coating liquid was dried with warm air at 60° C. for 60 seconds and further with warm air at 100° C. for 120 seconds to obtain an alignment film A.

Composition of Alignment Film A Coating Liquid

| | |
|---|---|
| Polyvinyl alcohol-1 shown below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Chemical Co., Ltd.) | 0.175 parts by mass |

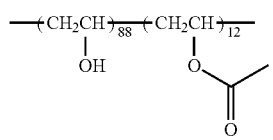

Polyvinyl alcohol-1

(Formation of Optically Anisotropic Layer X)

The prepared alignment film A was continuously subjected to a rubbing treatment. At this time, the longitudinal direction of the elongated film was parallel to the conveying direction, and the angle formed between the longitudinal direction of the film and the rotational axis of the rubbing roller was 45° (assuming that the film width direction is 0° and the film longitudinal direction is 90°, and with viewing from the alignment film A side and the clockwise direction being expressed as a positive value with respect to the film width direction, the rotational axis of the rubbing roller is 45°).

An optically anisotropic layer X coating liquid containing a reciprocal wavelength dispersible liquid crystal compound having the following composition was applied onto the above-prepared alignment film A. The film conveying speed was 26 m/min. Next, in order to dry the solvent of the coating liquid and age the alignment of the liquid crystal compound, the film coated with an optically anisotropic layer X coating liquid was heated with warm air at 100° C. for 60 seconds. Thereafter, the resulting film was irradiated with ultraviolet (UV) light of 300 mJ/cm$^2$ at 60° C. to immobilize the alignment of the liquid crystal compound, thereby preparing an optically anisotropic layer X.

The thickness of the optically anisotropic layer X was 1.8 μm. The average inclination angle of the liquid crystal compound with respect to the film plane was 0°, and it was confirmed that the liquid crystal compound was horizontally aligned with respect to the film plane. The angle of the slow axis was orthogonal to the rotational axis of the rubbing roller and was 135° assuming that the film width direction was 0° (the film longitudinal direction was 90°). The cellulose acylate film and the alignment film A were closely attached to each other, and the optically anisotropic layer X was peelable from the alignment film A.

Composition of Optically Anisotropic Layer X Coating Liquid

| | |
|---|---|
| Reciprocal wavelength dispersible liquid crystal compound -1 | 100 parts by mass |
| Photopolymerization initiator (IRGACURE 907, manufactured by BASF Corporation) | 3.0 parts by mass |
| Fluorine-containing compound (F-1) | 0.2 parts by mass |
| Fluorine-containing compound (F-2) | 0.4 parts by mass |
| Methyl ethyl ketone | 414 parts by mass |

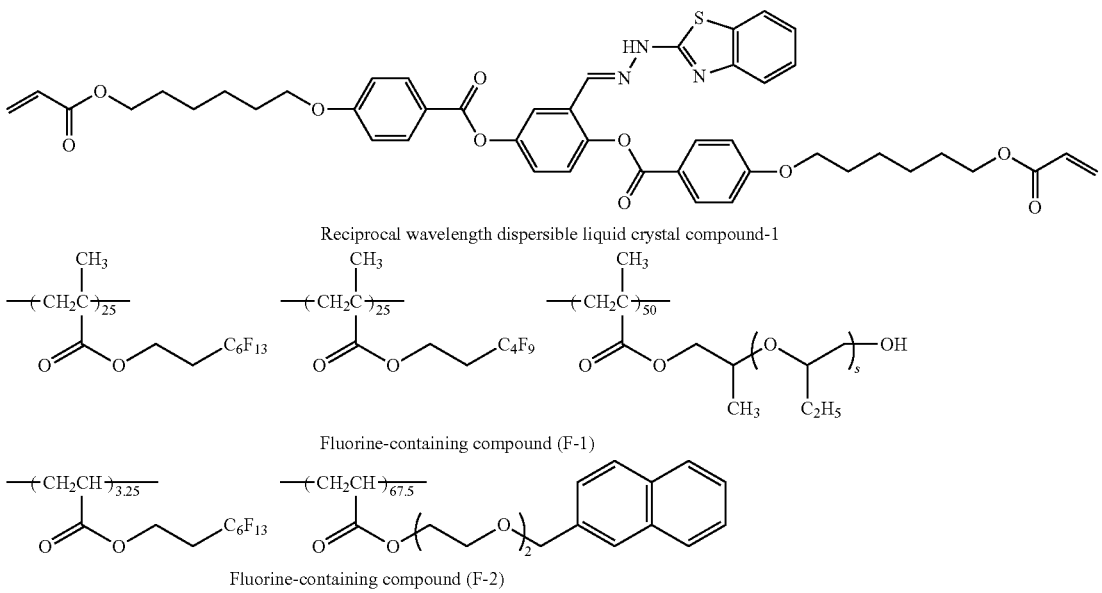

<Preparation of Forward Wavelength Dispersible Optically Anisotropic Layer (W)>

In the same manner as described above, an alignment film A was prepared on an elongated cellulose acylate film (TD80UL, manufactured by FUJIFILM Corporation), and the alignment film A was continuously subjected to a rubbing treatment. At this time, the longitudinal direction of the elongated film was parallel to the conveying direction, and the angle formed between the longitudinal direction of the film and the rotational axis of the rubbing roller was 135° (assuming that the film width direction is 0° and the film longitudinal direction is 90°, and with viewing from the alignment Film A side and the clockwise direction being expressed as a positive value with respect to the film width direction, the rotational axis of the rubbing roller is 135°).

An optically anisotropic layer W coating liquid containing a discotic liquid crystal (forward wavelength dispersible) compound having the following composition was applied onto the prepared alignment film A. The film conveying speed was 26 m/min. Next, in order to dry the solvent of the coating liquid and age the alignment of the discotic liquid crystal compound, the film coated with an optically anisotropic layer W coating liquid was heated with warm air at 120° C. for 90 seconds. Thereafter, the resulting film was irradiated with ultraviolet (UV) light of 300 ml/cm² at 80° C. to immobilize the alignment of the liquid crystal compound, thereby preparing an optically anisotropic layer W.

The thickness of the optically anisotropic layer W was 0.5 μm. The average inclination angle of the disc plane of the discotic liquid crystal compound with respect to the film plane was 90°, and it was confirmed that the discotic liquid crystal compound was vertically aligned with respect to the film plane. The angle of the slow axis was orthogonal to the rotational axis of the rubbing roller and was 45° assuming that the film width direction was 0° (the film longitudinal direction was 90°). The cellulose acylate film and the alignment film A were closely attached to each other, and the optically anisotropic layer W was peelable from the alignment film A.

Composition of Optically Anisotropic Layer W Coating Liquid

| | |
|---|---|
| Discotic liquid crystal compound given below | 91 parts by mass |
| Ethylene oxide-modified trimethylolpropane triacrylate (V#360, manufactured by Osaka Organic Chemical Industry Ltd.) | 5 parts by mass |
| Photopolymerization initiator (IRGACURE 907, manufactured by BASF Corporation) | 3 parts by mass |
| Sensitizer (KAYACURE DETX, manufactured by Nippon Kayaku Co., Ltd.) | 1 part by mass |
| Pyridinium salt given below | 0.5 parts by mass |
| Fluorine-containing compound (F-1) | 0.2 parts by mass |
| Fluorine-containing compound (F-3) | 0.1 parts by mass |
| Methyl ethyl ketone | 552 parts by mass |

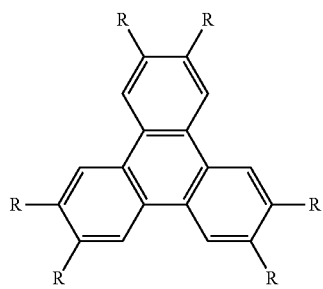
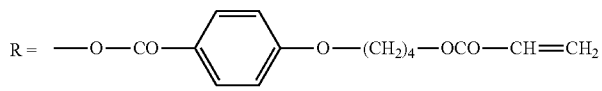

Discotic liquid crystal compound

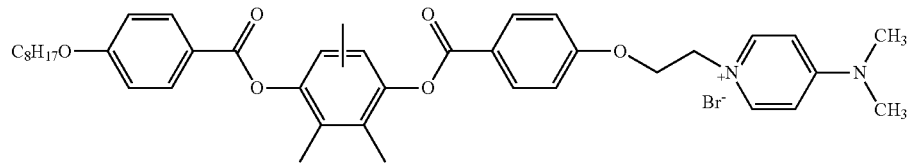

Pyridinium salt

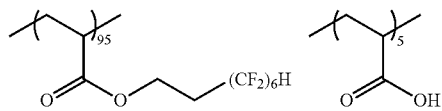

Fluorine-containing compound (F-3)

<Preparation of Polarizing Plate>

The following composition was charged into a mixing tank and stirred to dissolve individual components to prepare a core layer cellulose acylate dope 1.

| | |
|---|---|
| Cellulose acetate having an acetyl substitution degree of 2.88 | 100 parts by mass |
| Ester oligomer (Compound 1-1) | 10 parts by mass |
| Durability improver (Compound 1-2) | 4 parts by mass |
| Ultraviolet absorbing agent (compound 1-3) | 3 parts by mass |
| Methylene chloride (first solvent) | 438 parts by mass |
| Methanol (second solvent) | 65 parts by mass |

Compound 1-1

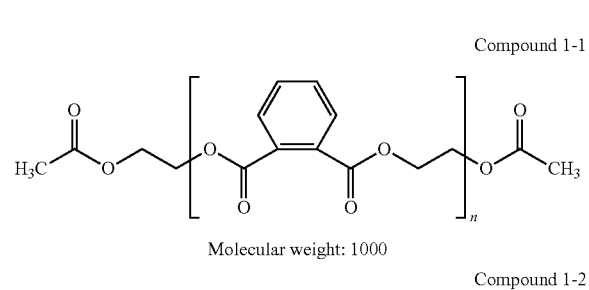

Molecular weight: 1000

Compound 1-2

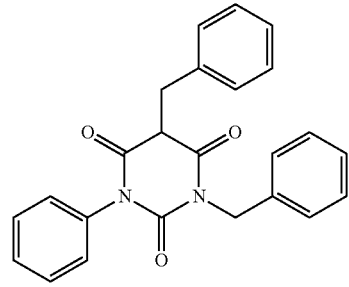

-continued

Compound 1-3

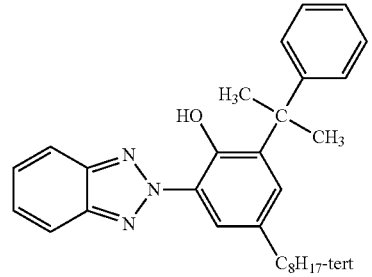

(Preparation of Outer Layer Cellulose Acylate Dope 1)

10 parts by mass of a matting agent dispersion liquid 1 having the following composition was added to the above-mentioned core layer cellulose acylate dope 1 (90 parts by mass) to prepare an outer layer cellulose acylate dope 1.

| Matting agent dispersion liquid 1: | |
|---|---|
| Silica particles having an average particle size of 20 nm (AEROSLL R 972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope 1 | 1 part by mass |

(Preparation of Cellulose Acylate Film)

Three layers of core layer cellulose acylate dope 1 and outer layer cellulose acylate dope 1 on both sides thereof were cast simultaneously onto a drum at 20° C. from a casting port to prepare a film. The film was peeled from the drum in a state where the solvent content of the film was approximately 20 mass %, and both ends in the width direction of the film were fixed with tenter clips. Then, the film was dried while stretching the film 12 times in the transverse direction in a state where the residual solvent was 3 to 15 mass %. Thereafter, the obtained film was conveyed between the rolls of a heat treatment apparatus to prepare a cellulose acylate film having a thickness of 25 μm, which was used as a polarizing plate protective film 01.

(Preparation of Hard Coat Layer)

As a coating liquid for funning a hard coat layer, the following curable composition 1 for hard coat was prepared.

TABLE 1

| | Monomer | | | | UV initiator | | |
|---|---|---|---|---|---|---|---|
| | Monomer 1 | Monomer 2 | Monomer 1/ Monomer 2 | Total amount added [parts by mass] | Type | Amount added [parts by mass] | Solvent |
| Hard coat 1 | Pentaerythritol triacrylate | Pentaerythritol tetraacrylate | 3/2 | 53.5 | UV initiator 1 | 1.5 | Ethyl acetate |

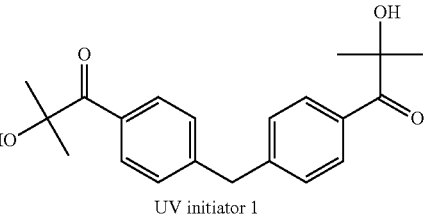

UV initiator 1

The curable composition 1 for hard coat was applied onto the surface of the polarizing plate protective film 01 prepared above. Thereafter, the polarizing plate protective film 01 coated with the curable composition 1 for hard coat was dried at 100° C. for 60 seconds, and the curable composition 1 for hard coat on the polarizing plate protective film 01 was cured with irradiation of UV light at 1.5 kW and at 300 mJ/cm² under the conditions of nitrogen of 0.1% or less, thereby preparing a polarizing plate protective film 01 with a hard coat layer which has a hard coat layer with a thickness of 5 μm.

(Preparation of Polarizing Plate)

1) Saponification of Film

The polarizing plate protective film 01 with a hard coat layer thus prepared was immersed in. a 4.5 mold. sodium hydroxide aqueous solution (saponification solution) controlled to 37° C. for 1 minute. Thereafter, the resulting film was washed with water, then immersed in a 0.05 mol/L sulfuric acid aqueous solution for 30 seconds, and further passed through a water bath. Water was drained three times with an air knife for removing water from the film, and the resulting film was dried by retaining in a drying zone at 70° C. for 15 seconds, thereby preparing a saponified polarizing plate protective film 01 with a hard coat layer.

2) Preparation of Polarizing Layer

The film was stretched in the longitudinal direction with two pairs of nip rolls having a difference in circumferential speed according to Example 1 of JP2001-141926A, thereby preparing a polarizing layer 1 having a width of 1330 mm and a thickness of 15 μm.

3) Adhesion

The polarizing layer 1 and the saponified polarizing plate protective film 01 with a hard coat layer were adhered to each other by a roll-to-roll process using a 3% aqueous solution of polyvinyl alcohol (PVA) (PVA-117H, manufactured by Kuraray Co., Ltd.) as an adhesive, thereby preparing a polarizing plate with a single-sided protective film 01. At this time, the cellulose acylate film side of the polarizing plate protective film was adhered to the polarizing layer 1 side.

<Lamination of Polarizing plate, Optically Anisotropic Layer X, and Optically Anisotropic Layer W>

A pressure sensitive adhesive layer (thickness: 10 μm) was continuously adhered to the polarizing layer 1 side (side having no protective film) of the above-prepared polarizing plate 01 with a single-sided protective film. Subsequently, a film having the cellulose acylate film, the alignment film A, and the optically anisotropic layer X prepared above was continuously adhered so that the pressure sensitive adhesive layer and the optically anisotropic layer X were closely attached to each other. Thereafter, the cellulose acylate film and the alignment film A were peeled off from the obtained film, and then a pressure sensitive adhesive layer (thickness: 10 μm) was continuously adhered onto the optically anisotropic layer X. Subsequently, a film having the cellulose acylate film, the alignment film A, and the optically anisotropic layer W prepared above was continuously adhered so that the pressure sensitive adhesive layer and the optically anisotropic layer W were closely attached to each other. Thereafter, the cellulose acylate film and the alignment film A were peeled off from the obtained film. In this manner, an elongated circularly polarizing film in which the optically anisotropic layer X and the optically anisotropic layer W were laminated in this order was prepared on the polarizing plate 01 with a single-sided protective film. Further, assuming that the width direction of the circularly polarizing film was 0° (the longitudinal direction was 90°), in the case of viewing from the protective film side of the polarizing plate 01 with a single-sided protective film, the absorption axis of the polarizing layer 1 was 90°, the slow axis of the optically anisotropic layer X was 135°, and the slow axis of the optically anisotropic layer W was 45°.

Example 2

<Preparation of Reciprocal Wavelength Dispersible Optically Anisotropic Layer (Y)>

In the same manner as in Example 1, the alignment film A prepared on the cellulose acylate film was continuously subjected to a rubbing treatment. At this time, the longitudinal direction of the elongated film was parallel to the conveying direction, and the angle formed between the longitudinal direction of the film and the rotational axis of the rubbing roller was 45° (assuming that the film width direction is 0° and the film longitudinal direction is 90°, and with viewing from the alignment film A side and the clockwise direction being expressed as a positive value with respect to the film width direction, the rotational axis of the rubbing roller is 45°).

An optically anisotropic layer Y coating liquid containing a reciprocal wavelength dispersible liquid crystal compound having the following composition was applied onto the prepared alignment film A. The film conveying speed was 26 m/min. Next, in order to dry the solvent of the coating liquid and age the alignment of the liquid crystal compound, the film coated with an optically anisotropic layer Y coating liquid was heated with warm air at 120° C. for 60 seconds. Thereafter, the resulting film was irradiated with ultraviolet (UV) light of 300 mJ/cm$^2$ at 70° C. to immobilize the alignment of the liquid crystal compound, thereby preparing an optically anisotropic layer Y.

The thickness of the optically anisotropic layer Y was 1.6 μm. The average inclination angle of the liquid crystal compound with respect to the film plane was 0°, and it was confirmed that the liquid crystal compound was horizontally aligned with respect to the film plane. The angle of the slow axis was orthogonal to the rotational axis of the rubbing roller and was 135° assuming that the film width direction was 0° (the film longitudinal direction was 90°). The cellulose acylate film and the alignment film A were closely attached to each other, and the optically anisotropic layer Y was peelable from the alignment film A.

Composition of Optically Anisotropic Layer Y Coating Liquid

| | |
|---|---|
| Reciprocal wavelength dispersible liquid crystal compound -2 | 100 parts by mass |
| Photopolymerization initiator (IRGACURE 819, manufactured by BASF Corporation) | 3.0 parts by mass |
| Fluorine-containing compound (F-1) | 0.2 parts by mass |
| Fluorine-containing compound (F-2) | 0.4 parts by mass |
| Chloroform | 588 parts by mass |

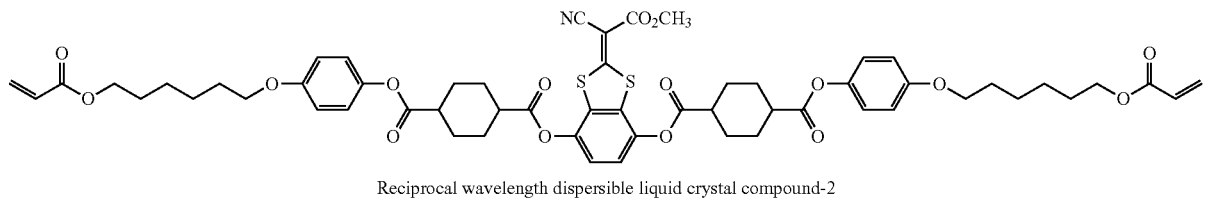 [SMILES: C=CC(=O)OCCCCCCOc1ccc(OC(=O)C2CCC(C(=O)Oc3ccc(OC(=O)C4CCC(C(=O)Oc5ccc(OCCCCCCOC(=O)C=C)cc5)CC4)c4c3SC(=C(C#N)C(=O)OC)S4)CC2)cc1]

Reciprocal wavelength dispersible liquid crystal compound-2

<Preparation of Forward Wavelength Dispersible Optically Anisotropic Layer (W')>

An optically anisotropic layer W' was prepared in the same manner as in Example 1, except that the thickness was changed to 0.2 μm in the preparation of the optically anisotropic layer W of Example 1.

<Lamination of Polarizing Plate, Optically Anisotropic layer Y, and Optically Anisotropic Layer W'>

In the same manner as in Example 1, an elongated circularly polarizing film in which the optically anisotropic layer Y and the optically anisotropic layer W' were laminated in this order was prepared on the polarizing plate 01 with a single-sided protective film. Further, assuming that the width direction of the circularly polarizing film was 0° (the longitudinal direction was 90°), in the case of viewing front the protective film side of the polarizing plate 01 with a single-sided protective film, the absorption axis of the polarizing layer 1 was 90°, the slow axis of the optically anisotropic layer Y was 135°, and the slow axis of the optically anisotropic layer W' was 45°.

Example 3

<Preparation of Reciprocal Wavelength Dispersible Optically Anisotropic Layer (Z)>

According to the method described in Example 4 of JP2012-150477A, a reciprocal wavelength dispersible optically anisotropic layer Z made of a polycarbonate copolymer was prepared.

<Preparation of Forward Wavelength Dispersible Optically Anisotropic Layer (W")>

An optically anisotropic layer W" was prepared in the same manner as in Example 1, except that the thickness was changed to 0.58 μm in the preparation of the optically anisotropic layer W of Example 1.

<Lamination of Polarizing Plate, Optically Anisotropic Layer W", and Optically Anisotropic Layer Z>

A polarizing plate 01 with a single-sided protective film was prepared in the same manner as in Example 1, and a pressure sensitive adhesive layer (thickness: 10 μm) was continuously adhered to the polarizing layer 1 side (side having no protective film). Subsequently, a film having the cellulose acylate film, the alignment film A, and the optically anisotropic layer W prepared above was continuously adhered so that the pressure sensitive adhesive layer and the optically anisotropic layer W" were closely attached to each other, Thereafter, the cellulose acylate film and the alignment film A were peeled off from the obtained film, and then a pressure sensitive adhesive layer (thickness: 10 μm) was continuously adhered onto the optically anisotropic layer W". Subsequently, the optically anisotropic layer Z prepared above was adhered to the pressure sensitive adhesive layer so as to be closely attached to each other. The laminate of the elongated polarizing plate and the optically anisotropic layer W" and the elongated optically anisotropic layer Z were adhered after being respectively punched into sheets of appropriate sizes.

Assuming that the absorption axis of the polarizing layer 1 was 90° in the case of viewing from the protective film side of the polarizing plate 01 with a single-sided protective film, the slow axis of the optically anisotropic layer Z was 135° and the slow axis of the optically anisotropic layer W" was 45°.

Example 4

<Preparation of Optically Anisotropic Layer (P)>

In the same manner as in Example 1, an alignment film A was prepared on a cellulose acylate film. An optically anisotropic layer P coating liquid containing a liquid crystal compound having the following composition was applied onto the alignment film A. The film conveying speed was 26 m/min. Next, in order to dry the solvent of the coating liquid and age the alignment of the liquid crystal compound, the film coated with an optically anisotropic layer P coating liquid was heated with warm air at 80° C. for 60 seconds. Thereafter, the resulting film was irradiated with ultraviolet (UV) light of 300 mJ/cm$^2$ at 60° C. to immobilize the alignment of the liquid crystal compound, thereby preparing an optically anisotropic layer P.

The thickness of the optically anisotropic layer P was 0.5 μm. The average inclination angle of the liquid crystal compound with respect to the film plane was 90°, and it was confined that the liquid crystal compound was vertically aligned with respect to the film plane. The cellulose acylate film and the alignment film A were closely attached to each other, and the optically anisotropic layer P was peelable from the alignment film A.

Composition of Optically Anisotropic Layer P Coating Liquid

| | |
|---|---|
| Rod-like liquid crystal compound (I) | 80 parts by mass |
| Rod-like liquid crystal compound (II) | 20 parts by mass |
| Photopolymerization initiator (IRGACURE 907, manufactured by BASF Corporation) | 3 parts by mass |
| Sensitizer (KAYACURE DETX, manufactured by Nippon Kayaku Co., Ltd.) | 1 part by mass |
| Fluorine-containing compound (F-4) | 0.4 parts by mass |
| Pyridinium salt given above | 1 part by mass |
| Methyl ethyl ketone | 272 parts by mass |

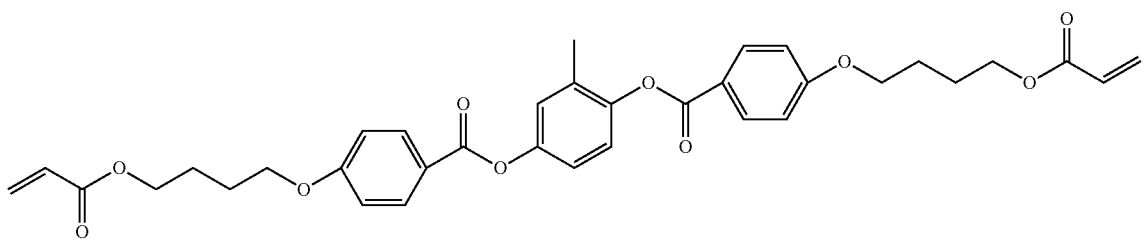

Rod-like liquid crystal compound (I)

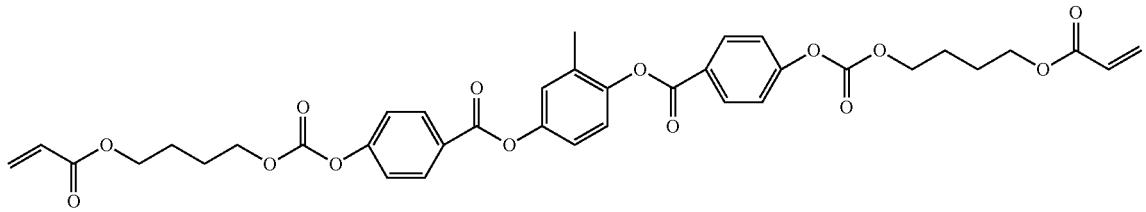

Rod-like liquid crystal compound (II)

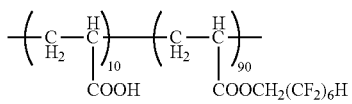

Fluorine-containing compound (F-4)

<Lamination of Polarizing Plate, Optically Anisotropic Layer X, and Optically Anisotropic Layer W and Optically Anisotropic Layer P>

In the same manner as in Example 1, an elongated polarizing plate in which the optically anisotropic layer X and the optically anisotropic layer W were laminated in this order was prepared on the polarizing plate 01 with a single-sided protective film. Further, a pressure sensitive adhesive layer (thickness: 10 μm) was continuously adhered to the optically anisotropic layer W. Subsequently, a film having the cellulose acylate film, the alignment film A, and the optically anisotropic layer P prepared above was continuously adhered so that the pressure sensitive adhesive layer and the optically anisotropic layer P were closely attached to each other. Thereafter, the cellulose acylate film and the alignment film A were peeled off from the obtained film. In this manner, an elongated circularly polarizing film in which the optically anisotropic layer X, the optically anisotropic layer W, and the optically anisotropic layer P were laminated in this order was prepared on the polarizing plate 01 with a single-sided protective film. Further, assuming that the width direction of the circularly polarizing film was 0° (the longitudinal direction was 90°), in the case of viewing from the protective film side of the polarizing plate 01 with a single-sided protective film, the absorption axis of the polarizing layer 1 was 90°, the slow axis of the optically anisotropic layer X was 135°, and the slow axis of the optically anisotropic layer W was 45°.

Comparative Example 1

<Lamination of Polarizing Plate and Optically Anisotropic Layer

An optically anisotropic layer X' was prepared in the same manner as in Example 1, except that the thickness was changed to 1.4 μm in the preparation of the optically anisotropic layer X of Example 1. Subsequently, an elongated circularly polarizing film having the optically anisotropic layer X' laminated on the polarizing plate 01 with a single-sided protective film was prepared in the same manner as in Example 1, except that the optically anisotropic layer W was not included. Further, assuming that the width direction of the circularly polarizing film was 0° (the longitudinal direction was 90°), in the case of viewing from the protective film side of the polarizing plate 01 with a single-sided protective film, the absorption axis of the polarizing layer 1 was 90°, and the slow axis of the optically anisotropic layer X' was 135°.

Comparative Example 2

<Preparation of Reciprocal Wavelength Dispersible Optically Anisotropic Layer (X")>

An optically anisotropic layer X" was prepared in the same manner as in Example 1, except that the thickness was changed to 1.9 μm in the preparation of the optically anisotropic layer X of Example 1. The average inclination angle of the liquid crystal compound with respect to the film plane was 0°, and it was confirmed that the liquid crystal compound was horizontally aligned with respect to the film plane. The angle of the slow axis was orthogonal to the rotational axis of the rubbing roller and was 135° assuming that the film width direction was 0° (the film longitudinal direction was 90°). The cellulose acylate film and the alignment film A were closely attached to each other, and the optically anisotropic layer X" was peelable from the alignment film A.

<Preparation of Forward Wavelength Dispersible Optically Anisotropic Layer>

In the same manner as in Example 1, the alignment film A prepared on the cellulose acylate film was continuously subjected to a rubbing treatment. At this time, the longitudinal direction of the elongated film was parallel to the conveying direction, and the angle formed between the longitudinal direction of the film and the rotational axis of the rubbing roller was 135° (assuming that the film width direction is 0° and the film longitudinal direction is 90°, and with viewing from the alignment film A side and the clockwise direction being expressed as a positive value with respect to the film width direction, the rotational axis of the rubbing roller is 135°).

An optically anisotropic layer R coating liquid containing a rod-like liquid crystal (forward wavelength dispersible) compound having the following composition was applied onto the above-prepared alignment film A. The film conveying speed was 26 m/min. Next, in order to dry the solvent of the coating liquid and ace the alignment of the liquid crystal compound, the film coated with an optically anisotropic layer R coating liquid was heated with warm air at 130° C. for 90 seconds and subsequently with warm air at 80° C. for 60 seconds. Thereafter, the resulting film was irradiated with ultraviolet (UV) light of 300 mJ/cm$^2$ at 60° C. to immobilize the alignment of the liquid crystal compound, thereby preparing an optically anisotropic layer R. The thickness of the optically anisotropic layer R was 0.4 μm. The average inclination angle of the liquid crystal compound with respect to the film plane was 0°, and it was confirmed that the liquid crystal compound was horizontally aligned with respect to the film plane. The angle of the slow axis was orthogonal to the rotational axis of the rubbing roller and was 45° assuming that the film width direction was 0° (the film longitudinal direction was 90°). The cellulose acylate film and the alignment film A were closely attached to each other, and the optically anisotropic layer R was peelable from the alignment film A.

Composition of Optically Anisotropic Layer R Coating Liquid

| | |
|---|---|
| Rod-like liquid crystal compound (I) | 80 parts by mass |
| Rod-like liquid crystal compound (II) | 20 parts by mass |
| Photopolymerization initiator (IRGACURE 907, manufactured by BASF Corporation) | 3 parts by mass |
| Sensitizer (KAYACURE DETX, manufactured by Nippon Kayaku Co., Ltd.) | 1 part by mass |
| Fluorine-containing compound (F-1) | 0.2 parts by mass |
| Fluorine-containing compound (F-2) | 0.4 parts by mass |
| Methyl ethyl ketone | 272 parts by mass |

<Lamination of Polarizing Plate, Optically Anisotropic Layer X", and Optically Anisotropic Layer R>

In the same manner as in Example 1, an elongated circularly polarizing film in which the optically anisotropic layer X" and the optically anisotropic layer R were laminated in this order was prepared on the polarizing plate 01 with a single-sided protective film. Further, assuming that the width direction of the circularly polarizing film was 0° (the longitudinal direction was 90°), in the case of viewing from the protective film side of the polarizing plate 01 with a single-sided protective film, the absorption axis of the polarizing layer 1 was 90°. the slow axis of the optically anisotropic layer X" was 135°, and the slow axis of the optically anisotropic layer R was 45°.

Comparative Example 3

<Preparation of Forward Wavelength Dispersible Optically Anisotropic Layer (RH)>

In the same manner as in Example 1, the alignment film A prepared on the cellulose acylate film was continuously subjected to a rubbing treatment. At this time, the longitudinal direction of the elongated film was parallel to the conveying direction, and the angle formed between the longitudinal direction of the film and the rotational axis of the rubbing roller was 45° (assuming that the film width direction is 0° and the film longitudinal direction is 90°, and with viewing from the alignment film A side and the clockwise direction being expressed as a positive value with respect to the film width direction, the rotational axis of the rubbing roller is 45°).

An optically anisotropic layer RH was prepared in the same manner as in Comparative Example 2, except that the thickness was changed to 2.0 μm in the preparation of the optically anisotropic layer R of Comparative Example 2. The average inclination angle of the liquid crystal compound with respect to the film plane was 0°, and it was confirmed that the liquid crystal compound was horizontally aligned with respect to the film plane. The angle of the slow axis was orthogonal to the rotational axis of the rubbing roller and was 135° assuming that the film width direction was 0° (the film longitudinal direction was 90°). The cellulose acylate film and the alignment film A were closely attached to each other, and the optically anisotropic layer RH was peelable from the alignment film A.

<Preparation of Forward Wavelength Dispersible Optically Anisotropic Layer (WQ)>

In the same manner as in Example 1, the alignment film A prepared on the cellulose acylate film was continuously subjected to a rubbing treatment. At this time, the longitudinal direction of the elongated film was parallel to the conveying direction, and the angle formed between the longitudinal direction of the film and the rotational axis of the rubbing roller was 135° (assuming that the m width direction is 0° and the film longitudinal direction is 90", and with viewing from the alignment film A side and the clockwise direction being expressed as a positive value with respect to the film width direction, the rotational axis of the rubbing roller is 135°).

An optically anisotropic layer WQ was prepared in the same manner as in Example 1, except that the thickness was changed to 1.7 μm in the preparation of the optically anisotropic layer W of Example 1. The average inclination angle of the disc plane of the discotic liquid crystal compound with respect to the film plane was 90°, and it was confirmed that the discotic liquid crystal compound was vertically aligned with respect to the film plane. The angle of the slow axis was orthogonal to the rotational axis of the rubbing roller and was 45° assuming that the film width direction was 0° (the film longitudinal direction was 90°). The cellulose acylate, film and the alignment film A were closely attached to each other, and the optically anisotropic layer WQ was peelable from the alignment film A.

<Lamination of Polarizing Plate, Optically Anisotropic Layer RH, and Optically Anisotropic Layer WQ>

In the same manner as in Example 1, an elongated circularly polarizing film in which the optically anisotropic layer RH and the optically anisotropic layer WQ were laminated in this order was prepared on the polarizing plate 01 with a single-sided protective film. Further, assuming that the width direction of the circularly polarizing film was 0° (the longitudinal direction was 90°), in the case of viewing from the protective film side of the polarizing plate 01 with a single-sided protective film, the absorption axis of the polarizing layer 1 was 90°, the slow axis of the optically anisotropic layer RH was 135°, and the slow axis of the optically anisotropic layer WQ was 45°.

<Measurement of Phase Difference of Optically Anisotropic Layer>

The phase difference was measured by transferring each single layer of the optically anisotropic layers prepared in the foregoing Examples and Comparative Examples to a pressure sensitive adhesive adhered on a glass substrate (the cellulose acylate film and the alignment film A are peeled off). Regarding measurement of phase difference of the optically anisotropic layer laminate (phase difference film), each optically anisotropic layer was transferred to the pressure sensitive adhesive adhered on the glass substrate (the cellulose acylate film and the alignment film A are peeled off), a pressure sensitive adhesive was farther adhered, a predetermined optically anisotropic layer was transferred thereon (the cellulose acylate film and the alignment film A are peeled off) to prepare an optically anisotropic layer laminate (phase difference Elm) having predetermined optically anisotropic layers laminated thereon, and then the phase difference thereof was measured. Using an automatic birefringence meter (KOBRA-21ADH, manufactured by Oji Scientific Instruments Co., Ltd.), light incidence angle dependence was measured to obtain retardation in the front direction (in-plane retardation) and retardation in the thickness direction. The results are shown in Table 2.

<Various Evaluations>
<Mounting on Organic EL Panel and Evaluation of Display Performance (Part 1)>

GALAXY S4 (manufactured by SAMSUNG Co., Ltd.) equipped with an organic EL panel was decomposed, the circularly polarizing film was peeled off, and the circularly polarizing films of Examples and Comparative. Examples were adhered thereto using a pressure sensitive adhesive. The visibility and display quality of the organic EL display device thus prepared were evaluated under light conditions. A screen on which a black image was displayed was observed from the front and at a polar angle of 45° and evaluated according to the following standards. The results are shown in Table 2.

[Front Tint]
A: The tint in the front direction is black or slightly colored (acceptable)
B: There is coloration in the front direction, which is thus unacceptable
[Viewing Angle Dependence]A: The difference in tint between the front and oblique directions is small and the tint is close to black (acceptable)
B: The difference in tint is visually recognized between the front and oblique directions, but it is acceptable
C: The difference in tint between the front and oblique directions is small, but the coloration is considerable (not black)
D: The difference in. tint between the front and oblique directions is considerable, and the coloration is also considerable, which is thus unacceptable
[Unevenness]
A: Unevenness is hardly visually recognized on the screen (acceptable)
B: Unevenness is visually recognized on the screen
C: Unevenness is remarkably visually recognized on the screen, which is thus unacceptable "ReX(450)", "ReX(550)", and "ReX(650)" in Table 2 represent the in-plane retardation of the phase difference film at a wavelength of 450 nm, a wavelength of 550 nm, and a wavelength of 650 nm, respectively. The "ReX(550)" also corresponds to the difference between the in-plane retardation ReA(550) of the Optically anisotropic layer A at a wavelength of 550 nm and the in-plane retardation ReB (550) of the optically anisotropic layer B at a wavelength of 550 nm.

The "RthX(550)" corresponds to the retardation of the phase difference film in the thickness direction at a wavelength of 550 nm.

TABLE 2

| | | Example 1 | Example 2 | Example 3 | Example 4 | Comparative Example 1 | Comparative Example 2 | Comparative Example 3 |
|---|---|---|---|---|---|---|---|---|
| Optically anisotropic layer A | Optically anisotropic layer | X | Y | Z | X | X' | X'' | RH |
| | ReA(550) | 178 nm | 154 nm | 184 nm | 178 nm | 138 nm | 192 nm | 276 nm |
| | RthA(550) | 89 nm | 77 nm | 92 nm | 89 nm | 69 nm | 96 nm | 138 nm |
| | ReA(450)/ReA(550) | 0.902 | 0.850 | 0.906 | 0.902 | 0.902 | 0.902 | 1.099 |
| | ReA(650)/ReA(550) | 1.012 | 1.010 | 1.035 | 1.012 | 1.012 | 1.012 | 0.950 |
| Optically anisotropic layer B | Optically anisotropic layer | W | W' | W'' | W | — | R | WQ |
| | ReB(550) | 40 nm | 16 nm | 46 nm | 40 nm | — | 54 nm | 138 nm |
| | RthB(550) | −20 nm | −8 nm | −23 nm | −20 nm | — | 27 nm | −69 nm |
| | ReB(450)/ReB(550) | 1.183 | 1.183 | 1.183 | 1.183 | — | 1.099 | 1.183 |
| | ReB(650)/ReB(550) | 0.920 | 0.920 | 0.920 | 0.920 | — | 0.950 | 0.920 |
| Optically anisotropic layer C | Optically anisotropic layer | — | — | — | P | — | — | — |
| | ReC(550) | — | — | — | 0 nm | — | — | — |
| | RthC(550) | — | — | — | −70 nm | — | — | — |
| | ReC(450)/ReC(550) | — | — | — | — | — | — | — |
| | ReC(650)/ReC(550) | — | — | — | — | — | — | — |
| Phase difference film (laminate of optically anisotropic layers) | Optically anisotropic layer | X + W | Y + W' | Z + W'' | X + W + P | X' | X'' + R | RH + WQ |
| | ReX(550) | 138 nm | 138 nm | 138 nm | 138 nm | 138 nm | 138 nm | 138 nm |
| | RthX(550) | 69 nm | 69 nm | 69 nm | −1 nm | 69 nm | 123 nm | 69 nm |
| | ReX(450)/ReX(550) | 0.820 | 0.811 | 0.813 | 0.820 | 0.902 | 0.825 | 1.015 |

TABLE 2-continued

|  |  | Example 1 | Example 2 | Example 3 | Example 4 | Comparative Example 1 | Comparative Example 2 | Comparative Example 3 |
|---|---|---|---|---|---|---|---|---|
|  | ReX(650)/ReX(550) | 1.039 | 1.021 | 1.073 | 1.039 | 1.012 | 1.041 | 0.980 |
| Evaluation | Front tint | A | A | A | A | B | A | B |
|  | Viewing angle dependence | B | B | B | A | C | D | C |
|  | Unevenness | A | A | A | A | A | B | C |

The organic EL display device having the circularly polarizing film of the present invention had excellent display quality even in the front direction and the oblique direction and had excellent uniformity without unevenness.

On the other hand, in the case of the circularly polarizing films of Comparative Examples, an organic EL display device satisfying all of the tint in the front direction, the tint in the oblique direction, and the uniformity was not obtained.

EXPLANATION OF REFERENCES 10, 100: phase difference film
12: optically anisotropic layer A
14: optically anisotropic layer B
16: optically anisotropic layer C
20, 200: circularly polarizing film
22: polarizing layer
24: transparent protective film

What is claimed is:

1. A circularly polarizing film comprising:
a phase difference film; and
a polarizing layer,
wherein the phase difference film comprises:
an optically anisotropic layer A; and
an optically anisotropic layer B,
wherein a retardation RthA of the optically anisotropic layer A in a thickness direction at a wavelength of 550 nm is larger than 0,
the optically anisotropic layer A satisfies the relationship of Expressions (A-1) to (A-3),
a retardation RthB of the optically anisotropic layer B in a thickness direction at a wavelength of 550 nm is smaller than 0,
the optically anisotropic layer B satisfies the relationship of Expressions (B-1) to (B-3),
the angle formed between a slow axis of the optically anisotropic layer A and a slow axis of the optically anisotropic layer B is 90°±10°, and
the phase difference film satisfies the relationship of Expressions (X-1) and (X-2), $$0.80 \leq \mathrm{Re}A(450)/\mathrm{Re}A(550) < 1 \qquad \text{Expression (A-1)}$$

$$1 < \mathrm{Re}A(650)/\mathrm{Re}A(550) \leq 1.30 \qquad \text{Expression (A-2)}$$

$$100\ \mathrm{nm} \leq \mathrm{Re}A(550) \leq 200\ \mathrm{nm} \qquad \text{Expression (A-3)}$$

$$1.08 \leq \mathrm{Re}B(450)/\mathrm{Re}B(550) \leq 1.30 \qquad \text{Expression (B-1)}$$

$$0.90 \leq \mathrm{Re}B(650)/\mathrm{Re}B(550) \leq 0.97 \qquad \text{Expression (B-2)}$$

$$0 < \mathrm{Re}B(550) \leq 50\ \mathrm{nm} \qquad \text{Expression (B-3)}$$

$$0.79 \leq \mathrm{Re}X(450)/\mathrm{Re}X(550) \leq 0.85 \qquad \text{Expression (X-1)}$$

$$1.02 \leq \mathrm{Re}X(650)/\mathrm{Re}X(550) \leq 1.30 \qquad \text{Expression (X-2)}$$

where ReA(450), ReA(550), and ReA(650) represent in-plane retardation values of the optically anisotropic layer A at a wavelength of 450 nm, a wavelength of 550 nm, and a wavelength of 650 nm, respectively,
ReB(450), ReB(550), and ReB(650) represent in-plane retardation values of the optically anisotropic layer B at a wavelength of 450 nm, a wavelength of 550 nm, and a wavelength of 650 nm, respectively, and
ReX(450), ReX(550), and ReX(650) represent in-plane retardation values of the phase difference film at a wavelength of 450 nm, a wavelength of 550 nm, and a wavelength of 650 nm, respectively, and
wherein the angle formed between the slow axis of the optically anisotropic layer A and the absorption axis of the polarizing layer is 45°±10°.

2. The circularly polarizing film according to claim 1, wherein the phase difference film comprises an optically anisotropic layer C having a retardation RthC of smaller than 0 in the thickness direction at a wavelength of 550 nm and satisfying the relationship of Expression (C-1), $$0 \leq \mathrm{Re}C(550) \leq 10\ \mathrm{nm} \qquad \text{Expression (C-1)}$$

wherein ReC(550) represents an in-plane retardation value of the optically anisotropic layer C at a wavelength of 550 nm.

3. The circularly polarizing film according to claim 1, wherein the difference between the in-plane retardation ReA(550) of the optically anisotropic layer A at a wavelength of 550 nm and the in-plane retardation ReB(550) of the optically anisotropic layer B at a wavelength of 550 nm is 110 to 170 nm.

4. The circularly polarizing film according to claim 2, wherein the difference between the in-plane retardation ReA(550) of the optically anisotropic layer A at a wavelength of 550 nm and the in-plane retardation ReB(550) of the optically anisotropic layer B at a wavelength of 550 nm is 110 to 170 nm.

5. An image display device comprising:
the circularly polarizing film according to claim 1.

6. An image display device comprising:
the circularly polarizing film according to claim 2.

7. An image display device comprising:
the circularly polarizing film according to claim 3.

8. An image display device comprising:
the circularly polarizing film according to claim 4.

* * * * *